US012575075B2

(12) United States Patent　　　　(10) Patent No.:　US 12,575,075 B2

Kim　　　　　　　　　　　　　　　　　(45) Date of Patent:　　Mar. 10, 2026

(54) SEMICONDUCTOR MEMORY DEVICE AND METHOD OF MANUFACTURING THE SAME

(71) Applicant: SAMSUNG ELECTRONICS CO., LTD., Suwon-si (KR)

(72) Inventor: Jeewoong Kim, Suwon-si (KR)

(73) Assignee: SAMSUNG ELECTRONICS CO., LTD., Suwon-si (KR)

( * ) Notice:　Subject to any disclaimer, the term of this patent is extended or adjusted under 35 U.S.C. 154(b) by 372 days.

(21) Appl. No.: 18/197,428

(22) Filed:　May 15, 2023

(65)　　　　Prior Publication Data

US 2024/0138136 A1　Apr. 25, 2024
US 2024/0237324 A9　Jul. 11, 2024

(30)　　Foreign Application Priority Data

Oct. 21, 2022　(KR) ........................ 10-2022-0136796

(51) Int. Cl.
　*H10B 10/00*　　(2023.01)
　*H01L 23/48*　　(2006.01)
　*H10D 30/67*　　(2025.01)
　*H10D 62/10*　　(2025.01)
(52) U.S. Cl.
　CPC ......... *H10B 10/125* (2023.02); *H01L 23/481* (2013.01); *H10D 30/6729* (2025.01); *H10D 30/6735* (2025.01); *H10D 30/6757* (2025.01); *H10D 62/121* (2025.01)
(58) Field of Classification Search
　CPC ...... H10B 10/125; H10B 10/12; H10B 10/18; H01L 23/481; H01L 21/76895; H01L 23/485; H01L 23/5286; H10D 30/6729; H10D 30/6735; H10D 30/6757; H10D 62/121; H10D 30/014; H10D 30/43; H10D 64/017; H10D 64/254; H10D 64/256; H10D 30/797; H10D 62/151; H10D 62/822;

(Continued)

(56)　　　　References Cited

U.S. PATENT DOCUMENTS

| | | | | |
|---|---|---|---|---|
| 6,169,313 B1 * | 1/2001 | Tsutsumi | ............... | H10B 10/12 |
| | | | | 257/E27.099 |
| 9,401,366 B1 * | 7/2016 | Lu | ......................... | H10D 86/011 |
| 10,381,354 B2 * | 8/2019 | Chanemougame | .... | H10B 10/12 |

(Continued)

FOREIGN PATENT DOCUMENTS

| | | | | | |
|---|---|---|---|---|---|
| CN | 101471345 A | * | 7/2009 | ........ | H10D 30/6735 |
| CN | 113540081 A | * | 10/2021 | ........ | H10D 30/6735 |

(Continued)

*Primary Examiner* — Mohammed Shamsuzzaman
(74) *Attorney, Agent, or Firm* — Muir Patent Law, PLLC

(57)　　　　ABSTRACT

A semiconductor memory device includes a substrate including first and second surfaces opposite to each other, a first active pattern on the first surface, a first channel pattern on the first active pattern and a first source/drain pattern connected to the first channel pattern, a gate electrode provided on the first channel pattern and extending in a first direction, the gate electrode adjacent to the first source/drain pattern in a second direction intersecting the first direction, a shared contact provided under the first source/drain pattern and the gate electrode and electrically connecting the first source/drain pattern and the gate electrode to each other, and a backside metal layer on the second surface.

18 Claims, 35 Drawing Sheets

(58) Field of Classification Search
  CPC ............. H10D 64/258; H10D 84/0149; H10D 84/038; H10D 89/10; B82Y 10/00; Y10S 257/90
  See application file for complete search history.

(56) References Cited

U.S. PATENT DOCUMENTS

| | | | | |
|---|---|---|---|---|
| 10,840,146 | B1 * | 11/2020 | Paul | H10D 64/017 |
| 11,289,606 | B2 | 3/2022 | Ju et al. | |
| 11,296,070 | B2 * | 4/2022 | Peng | H10D 84/907 |
| 12,029,024 | B2 * | 7/2024 | Bae | H10D 30/6729 |
| 2013/0107608 | A1 * | 5/2013 | Mann | H10B 10/125 257/347 |
| 2013/0258759 | A1 * | 10/2013 | Liaw | G06F 30/392 257/E21.53 |
| 2015/0372136 | A1 * | 12/2015 | Chang | H10D 64/037 257/314 |
| 2016/0284697 | A1 * | 9/2016 | Yoon | H10D 84/038 |
| 2017/0154994 | A1 * | 6/2017 | Pawlak | H01L 21/26513 |
| 2018/0286957 | A1 * | 10/2018 | Bae | H10D 84/0149 |
| 2019/0123052 | A1 * | 4/2019 | Zhou | G11C 11/412 |
| 2019/0267459 | A1 * | 8/2019 | Bae | H10D 84/038 |
| 2020/0111798 | A1 * | 4/2020 | Paul | H10D 30/6757 |
| 2021/0111270 | A1 * | 4/2021 | Sohn | H10D 30/025 |
| 2021/0272893 | A1 * | 9/2021 | Song | H01L 21/76832 |
| 2021/0343332 | A1 * | 11/2021 | Chiu | H10B 10/12 |
| 2021/0343744 | A1 | 11/2021 | Chiu et al. | |
| 2021/0358849 | A1 | 11/2021 | Chen | |
| 2022/0028779 | A1 | 1/2022 | Morrow et al. | |
| 2022/0037337 | A1 * | 2/2022 | Wang | H10D 89/10 |
| 2022/0059460 | A1 | 2/2022 | Do et al. | |
| 2022/0093594 | A1 | 3/2022 | Song et al. | |
| 2022/0109055 | A1 * | 4/2022 | Lee | H10D 30/62 |
| 2022/0130759 | A1 * | 4/2022 | Huang | H01L 21/76897 |
| 2022/0130823 | A1 * | 4/2022 | Su | H10D 30/6735 |
| 2022/0157786 | A1 * | 5/2022 | Chuang | H10D 64/62 |
| 2022/0320115 | A1 * | 10/2022 | Bae | H10D 89/10 |
| 2022/0336474 | A1 * | 10/2022 | Liaw | H10D 62/121 |
| 2022/0384591 | A1 * | 12/2022 | Lee | H10D 84/0149 |
| 2023/0013383 | A1 * | 1/2023 | Miao | H10D 84/038 |
| 2023/0343699 | A1 * | 10/2023 | Lu | H10D 84/017 |
| 2024/0021240 | A1 * | 1/2024 | Nien | H10D 89/10 |
| 2024/0324165 | A1 * | 9/2024 | Bae | H10D 30/6729 |
| 2024/0413216 | A1 * | 12/2024 | Lee | H10D 84/83 |

FOREIGN PATENT DOCUMENTS

| | | | | |
|---|---|---|---|---|
| CN | 113764017 A | * | 12/2021 | H10D 89/10 |
| CN | 114078768 A | * | 2/2022 | H10D 84/83 |
| DE | 102021105451 A1 | * | 11/2021 | H10D 89/10 |
| EP | 2551905 A2 | * | 1/2013 | G06F 30/392 |
| KR | 20180132492 A | * | 12/2018 | H01L 23/5223 |
| KR | 20240115699 A | * | 7/2024 | H10D 30/6757 |

* cited by examiner

FIG. 8C

SEMICONDUCTOR MEMORY DEVICE AND METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2022-0136796, filed on Oct. 21, 2022, in the Korean Intellectual Property Office, the entire contents of which are hereby incorporated by reference.

BACKGROUND OF THE INVENTION

1. Field

The present disclosure relates to a semiconductor memory device and a method of manufacturing the same, and more particularly, to a semiconductor memory device including a SRAM cell and a method of manufacturing the same.

2. Description of the Related Art

Semiconductor devices are widely used in an electronic industry because of their small sizes, multi-functional characteristics, and/or low manufacturing costs. Semiconductor devices may be categorized as any one of semiconductor memory devices for storing logical data, semiconductor logic devices for processing logical data, and hybrid semiconductor devices having both the function of the semiconductor memory devices and the function of the semiconductor logic devices. Semiconductor devices with excellent characteristics have been increasingly in demand with the development of the electronic industry. For example, high-reliable, high-speed and/or multi-functional semiconductor devices have been increasingly in demand. To satisfy these demands, semiconductor devices have been highly integrated and structures in semiconductor devices have become more and more complicated.

SUMMARY

In an aspect, a semiconductor memory device may include a substrate including a first surface and a second surface opposite to the first surface, a first active pattern on the first surface, a first channel pattern on the first active pattern and a first source/drain pattern connected to the first channel pattern, a gate electrode provided on the first channel pattern and extending in a first direction, the gate electrode adjacent to the first source/drain pattern in a second direction intersecting the first direction, a shared contact provided under the first source/drain pattern and the gate electrode and electrically connecting the first source/drain pattern and the gate electrode to each other, and a backside metal layer on the second surface.

In an aspect, a semiconductor memory device may include a SRAM cell on a substrate. The SRAM cell may include first pull-up/down transistors and second pull-up/down transistors; and a first node connecting a common source/drain of the first pull-up/down transistors to a common gate of the second pull-up/down transistors. The first node may include a shared contact connected to the common source/drain and the common gate to electrically connect the common source/drain and the common gate to each other. The shared contact may be buried in a lower portion of the substrate. The shared contact may include a backside active contact electrically connected to the common source/drain; and a backside gate contact electrically connected to the common gate.

In an aspect, a semiconductor memory device may include a substrate including a bit cell region; a first active pattern and a second active pattern on the bit cell region, the first active pattern spaced apart from the second active pattern in a first direction; a device isolation layer filling a trench between the first and second active patterns; a first channel pattern on the first active pattern and a first source/drain pattern connected to the first channel pattern; a second channel pattern on the second active pattern and a second source/drain pattern connected to the second channel pattern; a gate electrode provided on the first channel pattern and extending in the first direction; a gate insulating layer between the gate electrode and the first channel pattern; a gate spacer on at least one sidewall of the gate electrode; a gate capping pattern on the gate electrode; an interlayer insulating layer on the gate capping pattern; an active contact penetrating the interlayer insulating layer so as to be connected to the second source/drain pattern; a first metal layer on the interlayer insulating layer, the first metal layer including a bit line electrically connected to the active contact; and a shared contact provided under the first source/drain pattern and the gate electrode and electrically connecting the first source/drain pattern and the gate electrode to each other.

In an aspect, a method of manufacturing a semiconductor memory device may include forming an active pattern on a front surface of a substrate; forming a channel pattern and a source/drain pattern on the active pattern; forming a gate electrode extending in a first direction on the channel pattern; forming a backside contact hole exposing the source/drain pattern and the gate electrode through a back surface of the substrate; and forming a shared contact in the backside contact hole. The shared contact may electrically connect the source/drain pattern and the gate electrode to each other.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
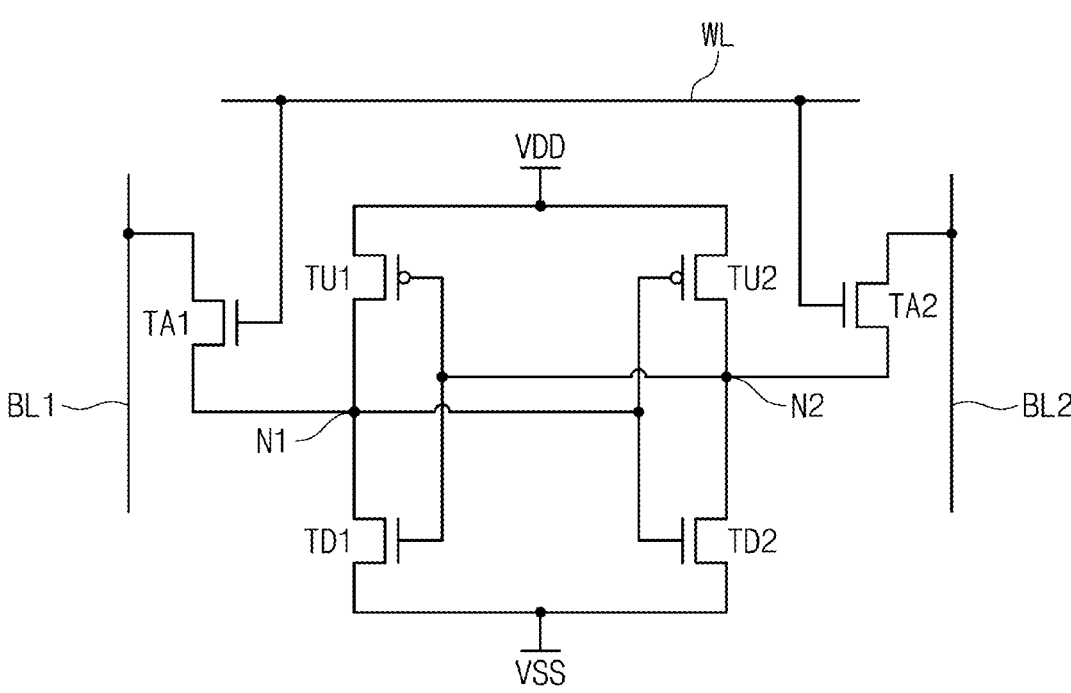
FIG. 1 is an equivalent circuit diagram illustrating a SRAM cell according to some embodiments.

FIG. 1 is an equivalent circuit diagram illustrating a SRAM cell according to some embodiments.

Referring to FIG. 1, a SRAM cell according to some embodiments may include a first pull-up transistor TU1, a first pull-down transistor TD1, a second pull-up transistor TU2, a second pull-down transistor TD2, a first pass-gate transistor TA1, and a second pass-gate transistor TA2. The first and second pull-up transistors TU1 and TU2 may be PMOS transistors. The first and second pull-down transistors TD1 and TD2 and the first and second pass-gate transistors TA1 and TA2 may be NMOS transistors.

A first source/drain of the first pull-up transistor TU1 and a first source/drain of the first pull-down transistor TD1 may be connected to a first node N1. A second source/drain of the first pull-up transistor TU1 may be connected to a power line VDD, and a second source/drain of the first pull-down transistor TD1 may be connected to a ground line VSS. A gate of the first pull-up transistor TU1 may be electrically connected to a gate of the first pull-down transistor TD1. The first pull-up transistor TU1 and the first pull-down transistor TD1 may constitute a first inverter. The gates, connected to each other, of the first pull-up and first pull-down transistors TU1 and TD1 may correspond to an input terminal of the first inverter, and the first node N1 may correspond to an output terminal of the first inverter.

A first source/drain of the second pull-up transistor TU2 and a first source/drain of the second pull-down transistor TD2 may be connected to a second node N2. A second source/drain of the second pull-up transistor TU2 may be connected to the power line VDD, and a second source/drain of the second pull-down transistor TD2 may be connected to the ground line VSS. A gate of the second pull-up transistor TU2 may be electrically connected to a gate of the second pull-down transistor TD2. Thus, the second pull-up transistor TU2 and the second pull-down transistor TD2 may constitute a second inverter. The gates, connected to each other, of the second pull-up and second pull-down transistors TU2 and TD2 may correspond to an input terminal of the second inverter, and the second node N2 may correspond to an output terminal of the second inverter.

The first and second inverters may be coupled to each other to constitute a latch structure. In other words, the gates of the first pull-up and first pull-down transistors TU1 and TD1 may be electrically connected to the second node N2, and the gates of the second pull-up and second pull-down transistors TU2 and TD2 may be electrically connected to the first node N1. A first source/drain of the first pass-gate transistor TA1 may be connected to the first node N1, and a second source/drain of the first pass-gate transistor TA1 may be connected to a first bit line BL1. A first source/drain of the second pass-gate transistor TA2 may be connected to the second node N2, and a second source/drain of the second pass-gate transistor TA2 may be connected to a second bit line BL2. Gates of the first and second pass-gate transistors TA1 and TA2 may be electrically connected to a word line WL. Thus, the SRAM cell according to the embodiments may be realized.

Figure 2:
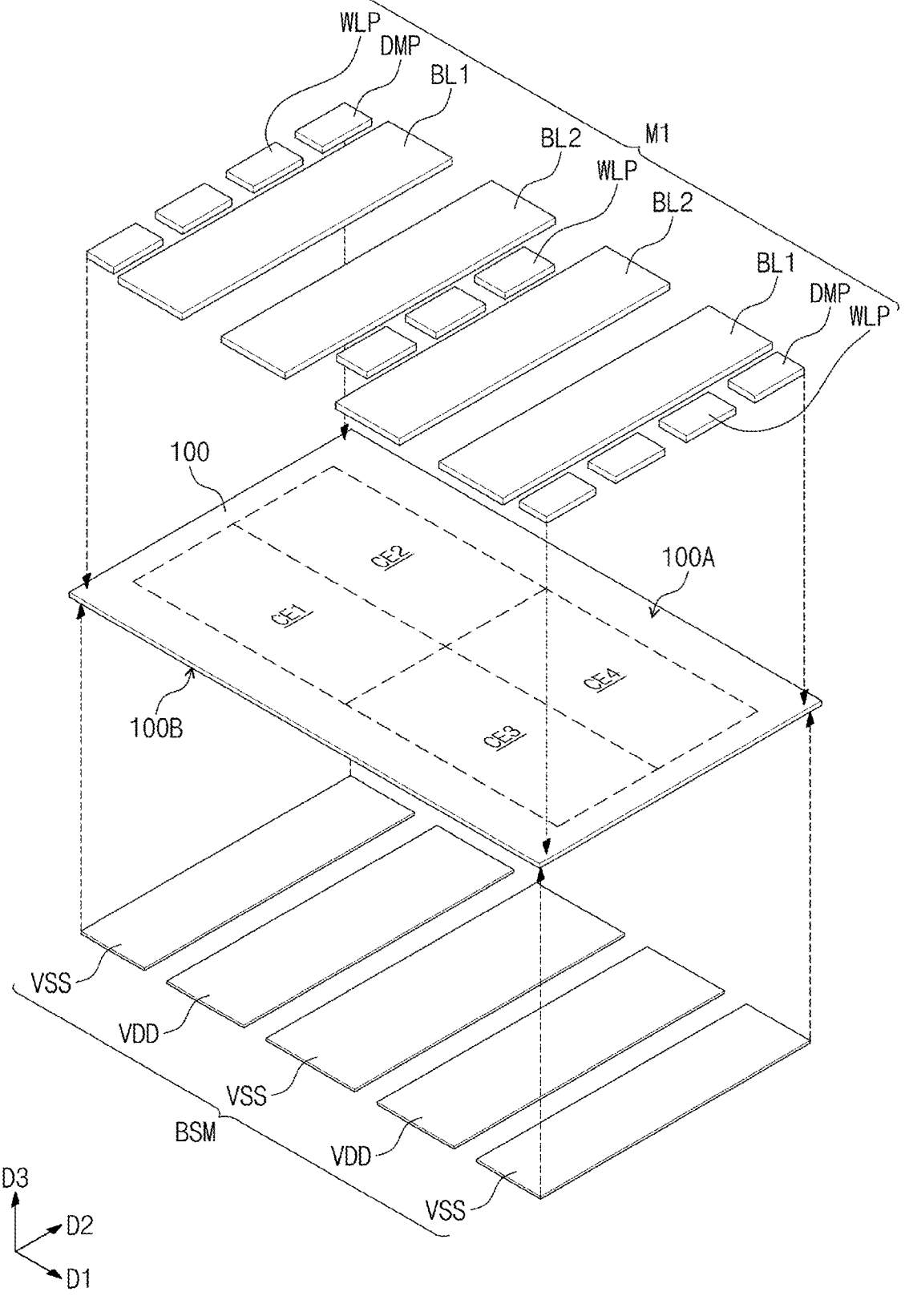
FIG. 2 is a perspective view illustrating interconnection layers of a semiconductor memory device according to some embodiments.

FIG. 2 is a perspective view illustrating interconnection layers of a semiconductor memory device according to some embodiments.

Referring to FIG. 2, memory cells CE1 to CE4 may be provided on a substrate 100. The memory cells CE1 to CE4 may include first to fourth bit cells CE1 to CE4 arranged in a 2×2 matrix form. Each of the first to fourth bit cells CE1 to CE4 may be the SRAM cell described above with reference to FIG. 1. Detailed structures of the first to fourth bit cells CE1 to CE4 will be described below with reference to FIGS. 3A to 4E.

The substrate 100 may include a first surface 100A and a second surface 100B opposite to the first surface 100A. The first surface 100A may be a front surface of the substrate 100. The second surface 100B may be a back surface of the substrate 100.

A first metal layer M1 may be provided on the first surface 100A of the substrate 100. The first metal layer M1 may be a lowermost metal layer of a BEOL layer. A backside metal layer BSM may be provided on the second surface 100B of the substrate 100. The backside metal layer BSM may be an uppermost metal layer of a backside power delivery network layer. Each of the first metal layer M1 and the backside metal layer BSM may include at least one of a conductive metal nitride (e.g., titanium nitride or tantalum nitride) or a metal material (e.g., titanium, tantalum, tungsten, copper, or aluminum).

The first metal layer M1 may include first bit lines BL1 and second bit lines BL2, which extend in a second direction D2. The first and second bit lines BL1 and BL2 may have line shapes when viewed in a plan view.

The first metal layer M1 may include word line pads WLP and dummy pads DMP. In some embodiments, the word line pad WLP and the dummy pad DMP may be provided at a side of each of the first and second bit lines BL1 and BL2. The word line pads WLP and the dummy pads DMP may be arranged in the second direction D2. Each of the word line pads WLP and the dummy pads DMP may have an island shape when viewed in a plan view. The word line pad WLP may be electrically connected to a word line WL in a second metal layer M2. The dummy pad DMP may be a floated metal pattern.

One of the first bit lines BL1, one of the second bit lines BL2, two of the word line pads WLP and two of the dummy pads DMP may be located on the first bit cell CE1. In some embodiments, at least one or all of the dummy pads DMP may be omitted.

The backside metal layer BSM may include ground lines VSS and power lines VDD, which extend in the second direction D2. The ground lines VSS and the power lines VDD may be alternately arranged in a first direction D1. Each of the ground lines VSS and the power lines VDD may have a line shape when viewed in a plan view. One of the power lines VDD and two of the ground lines VSS may be located under the first bit cell CE1.

According to some embodiments, the ground line VSS and the power line VDD may be completely omitted from the BEOL layer, which includes the first metal layer M1 on the first surface 100A. The BEOL layer including the first metal layer M1 on the first surface 100A may include the bit lines BL1 and BL2 and word lines WL but not include the ground line VSS and the power line VDD.

Figure 3A:
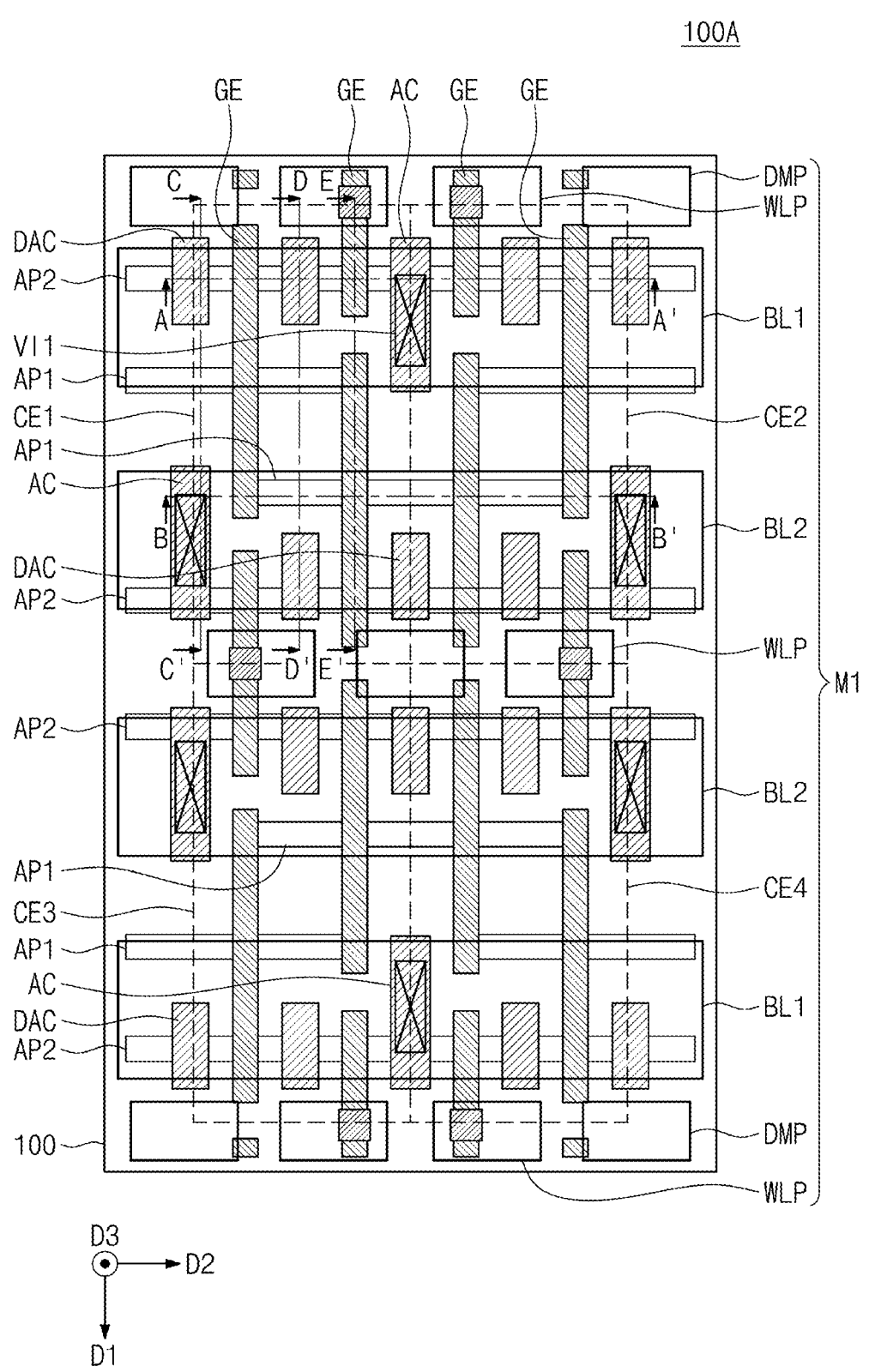
FIG. 3A is a plan view of a first surface of a substrate to illustrate a semiconductor memory device according to some embodiments.
Figure 3B:
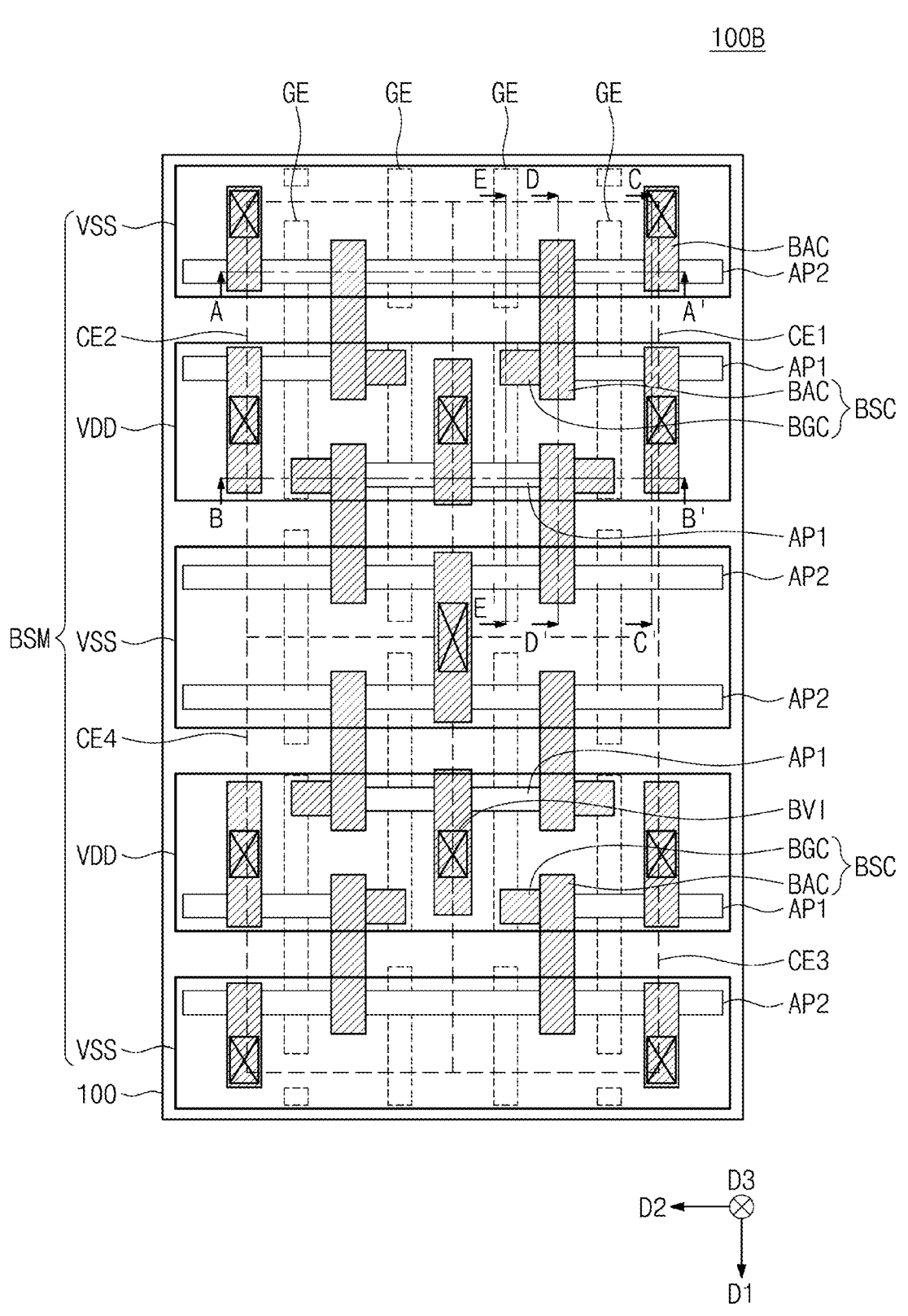
FIG. 3B is a plan view of a second surface of the substrate to illustrate a semiconductor memory device according to some embodiments.
Figure 4A:
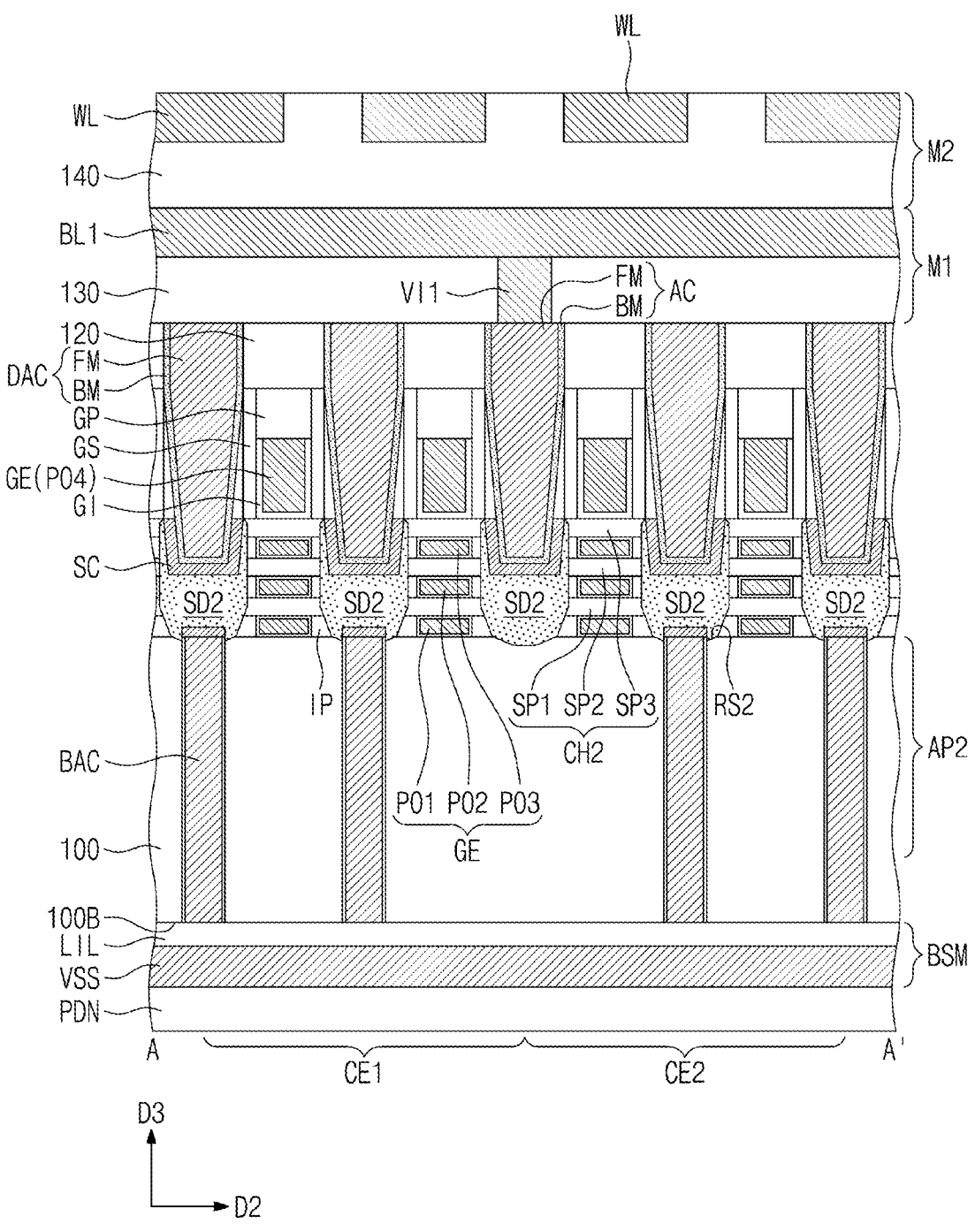
FIG. 4A is a cross-sectional view taken along lines A-A' of FIGS. 3A and 3B.
Figure 4B:
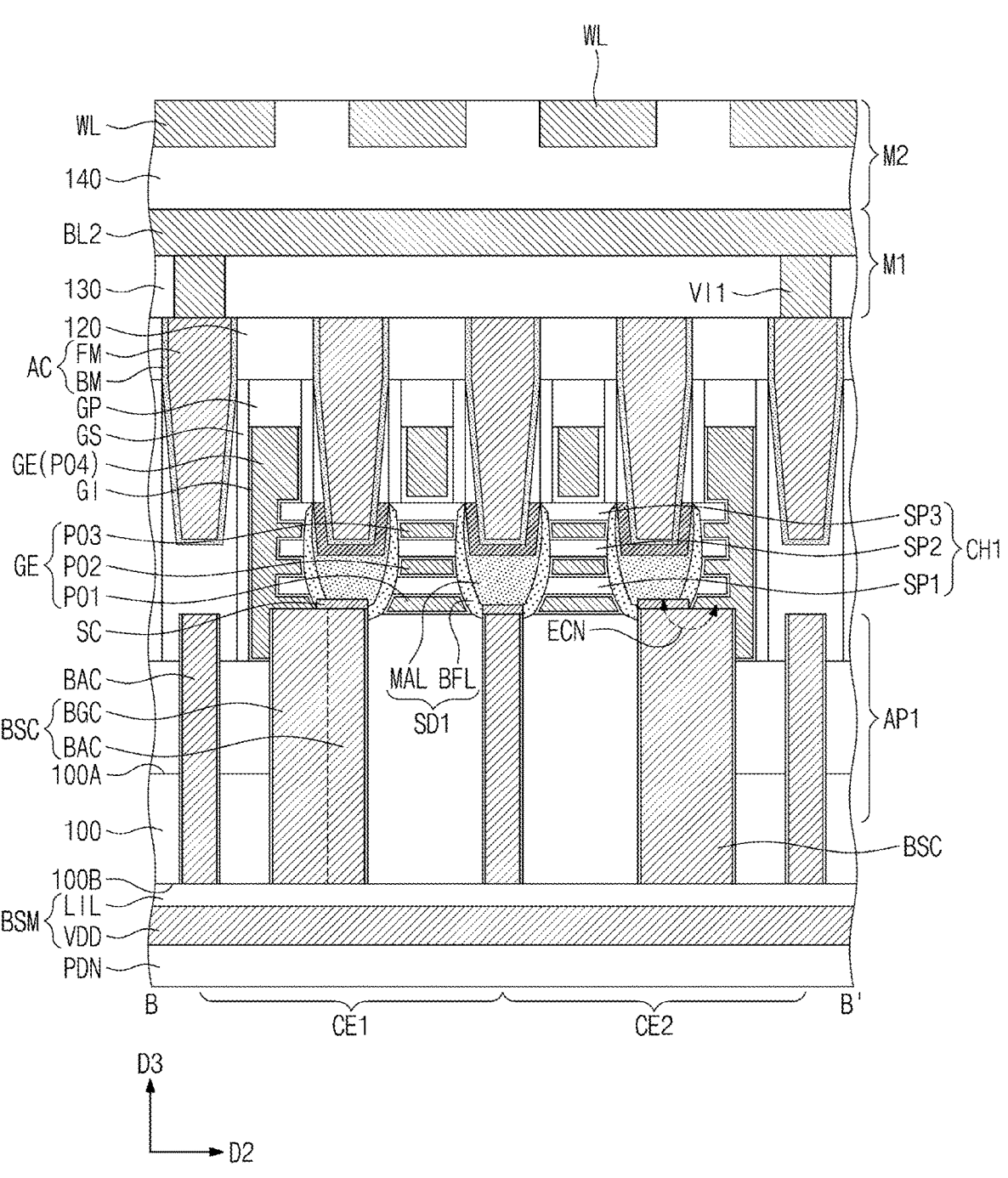
FIG. 4B is a cross-sectional view taken along lines B-B' of FIGS. 3A and 3B.
Figure 4C:
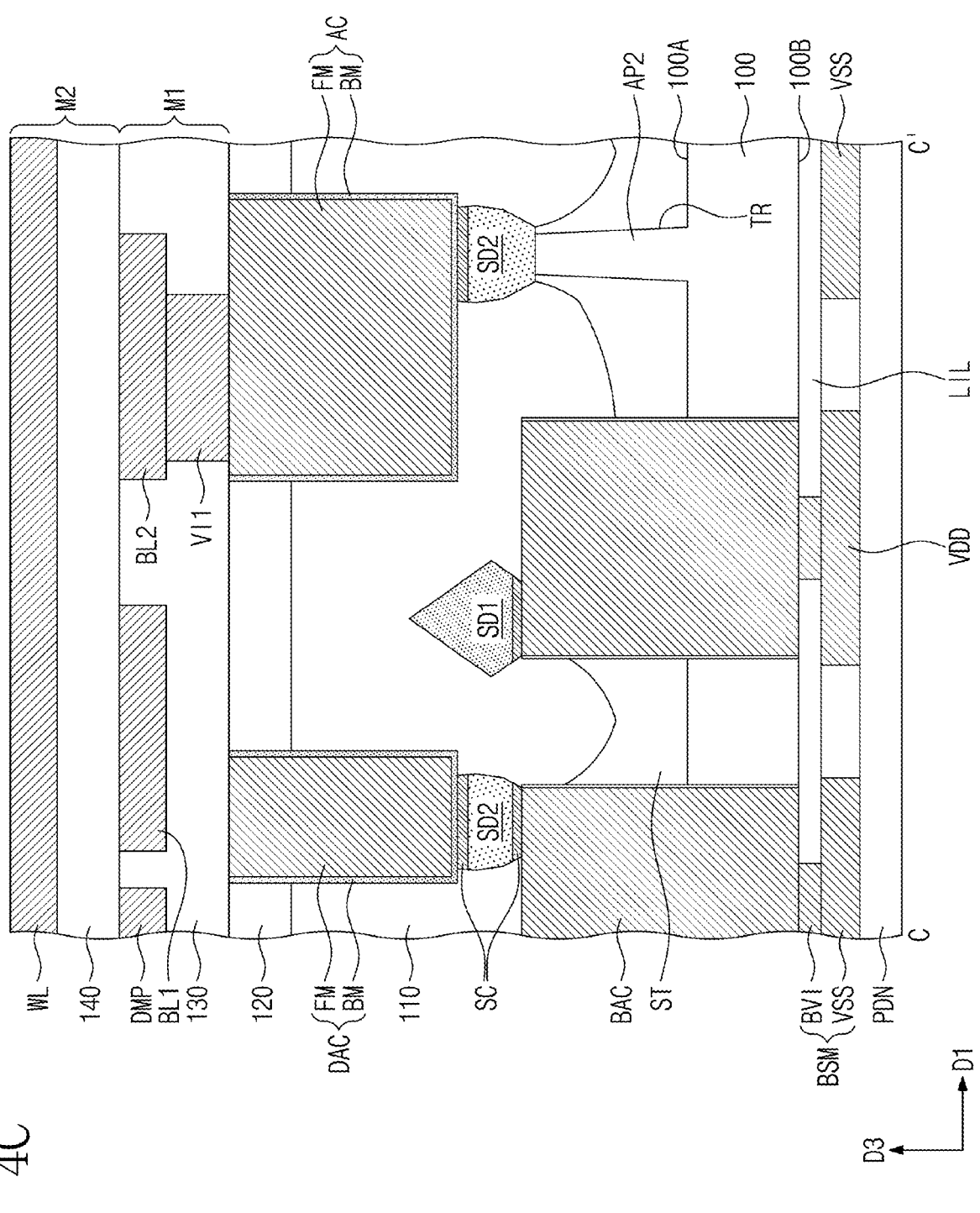
FIG. 4C is a cross-sectional view taken along lines C-C' of FIGS. 3A and 3B.
Figure 4D:
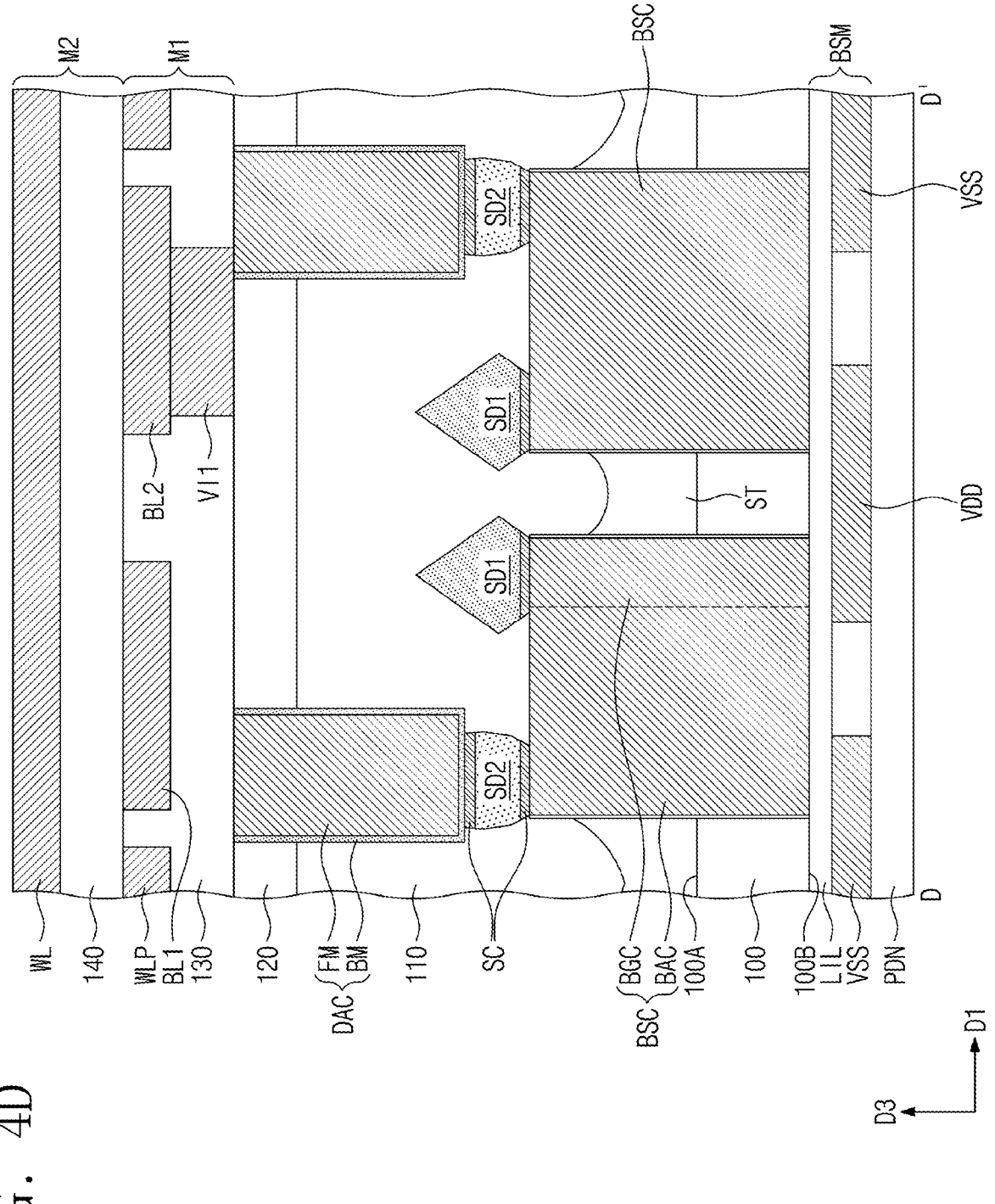
FIG. 4D is a cross-sectional view taken along lines D-D' of FIGS. 3A and 3B.
Figure 4E:
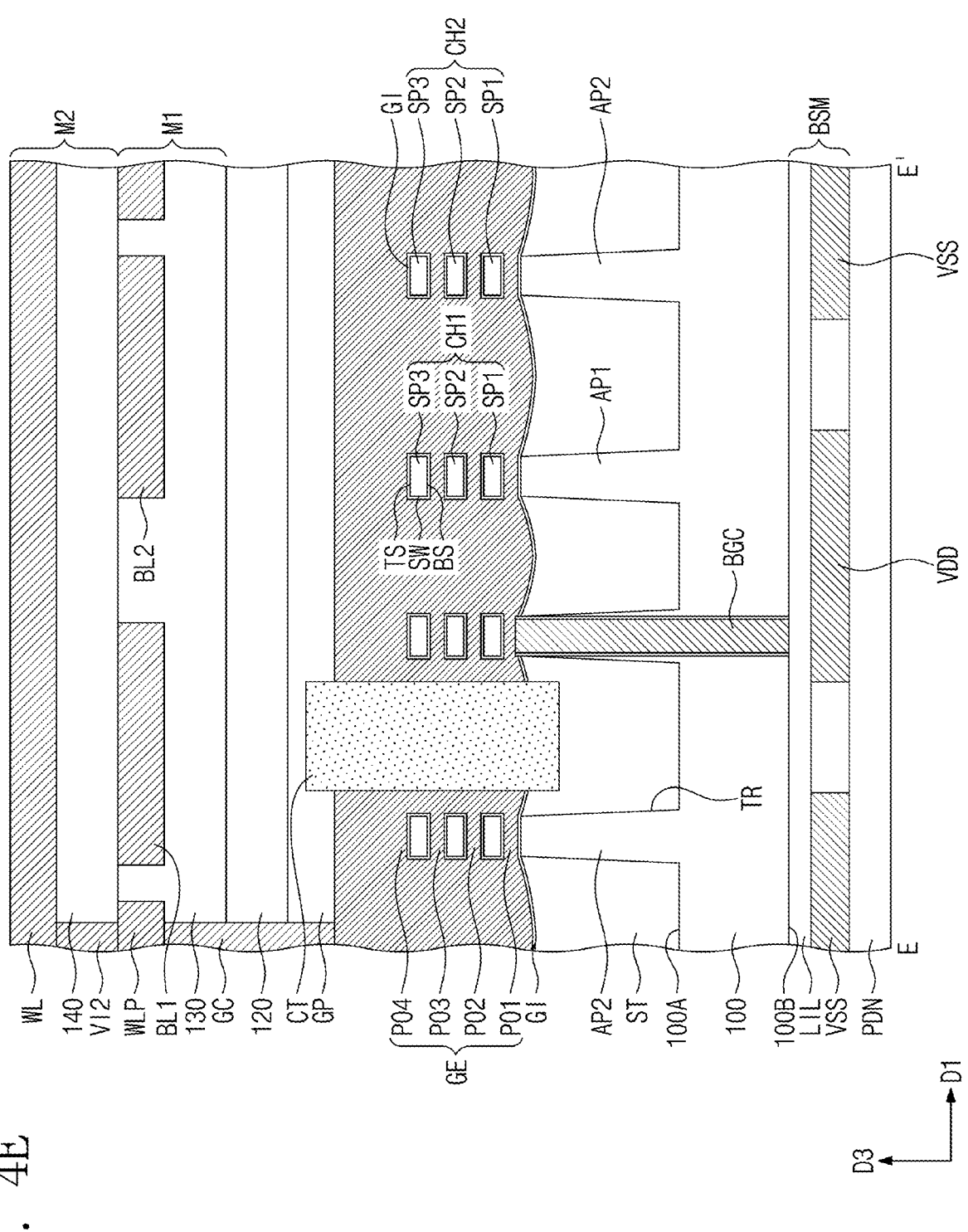
FIG. 4E is a cross-sectional view taken along lines E-E' of FIGS. 3A and 3B.

FIG. 3A is a plan view of a first surface of a substrate to illustrate a semiconductor memory device according to an embodiment. FIG. 3B is a plan view of a second surface of the substrate to illustrate a semiconductor memory device according to some embodiments. FIG. 4A is a cross-sectional view taken along lines A-A' of FIGS. 3A and 3B. FIG. 4B is a cross-sectional view taken along lines B-B' of FIGS. 3A and 3B. FIG. 4C is a cross-sectional view taken along lines C-C' of FIGS. 3A and 3B. FIG. 4D is a cross-sectional view taken along lines D-D' of FIGS. 3A and 3B. FIG. 4E is a cross-sectional view taken along lines E-E' of FIGS. 3A and 3B. Each of the first to fourth bit cells CE1 to CE4 according to the present embodiments may include the SRAM cell according to the circuit diagram of FIG. 1.

Referring to FIGS. 1, 3A, 3B and 4A to 4E, first and second active patterns AP1 and AP2 may be provided on the first surface 100A of the substrate 100. The substrate 100 may be a semiconductor substrate including silicon, germanium or silicon-germanium, or a compound semiconductor substrate. A device isolation layer ST (see FIG. 4C) may include an insulating material such as a silicon oxide layer.

The first and second active patterns AP1 and AP2 may be on portions of the substrate 100. A trench TR may be defined between the active patterns AP1 and AP2 adjacent to each other. The device isolation layer ST may fill the trench TR.

Each of the bit cells CE1 to CE4 may include a pair of the first active patterns AP1 and a pair of the second active patterns AP2. Referring again to FIG. 1, one of the pair of second active patterns AP2 may include a body of the first pass-gate transistor TA1 and a body of the first pull-down transistor TD1. The other of the pair of second active patterns AP2 may include a body of the second pass-gate transistor TA2 and a body of the second pull-down transistor TD2.

One of the pair of first active patterns AP1 may include a body of the first pull-up transistor TU1. The other of the pair of first active patterns AP1 may include a body of the second pull-up transistor TU2.

A first channel pattern CH1 may be provided on the first active pattern AP1. A second channel pattern CH2 may be provided on the second active pattern AP2. Each of the first channel pattern CH1 and the second channel pattern CH2 may include a first semiconductor pattern SP1, a second semiconductor pattern SP2 and a third semiconductor pattern SP3, which are sequentially stacked. The first to third semiconductor patterns SP1, SP2 and SP3 may be spaced apart from each other in a vertical direction (i.e., a third direction D3) (see FIG. 4A).

Each of the first to third semiconductor patterns SP1, SP2 and SP3 may include silicon (Si), germanium (Ge), or silicon-germanium (SiGe). For example, each of the first to third semiconductor patterns SP1, SP2 and SP3 may include crystalline silicon. Each of the first to third semiconductor patterns SP1, SP2 and SP3 may be a nanosheet.

A plurality of first source/drain patterns SD1 may be provided on the first active pattern AP1. A plurality of first recesses RS1 (FIG. 7B) may be formed on the first active pattern AP1. The first source/drain patterns SD1 may be provided in the first recesses RS1, respectively. The first source/drain patterns SD1 may be dopant regions having a first conductivity type (e.g., a p-type). The first channel pattern CH1 may be disposed between a pair of the first source/drain patterns SD1. In other words, the first to third semiconductor patterns SP1, SP2 and SP3 stacked sequentially may connect the pair of first source/drain patterns SD1 to each other.

A plurality of second source/drain patterns SD2 may be provided on the second active pattern AP2. A plurality of second recesses RS2 may be formed on the second active pattern AP2. The second source/drain patterns SD2 may be provided in the second recesses RS2, respectively. The second source/drain patterns SD2 may be dopant regions having a second conductivity type (e.g., an n-type). The second channel pattern CH2 may be disposed between a pair of the second source/drain patterns SD2. In other words, the first to third semiconductor patterns SP1, SP2 and SP3 stacked sequentially may connect the pair of second source/drain patterns SD2 to each other.

The first and second source/drain patterns SD1 and SD2 may be epitaxial patterns formed by a selective epitaxial growth (SEG) process. For example, a top surface of each of the first and second source/drain patterns SD1 and SD2 may be located at substantially the same level as a top surface of the third semiconductor pattern SP3. In some implementations, the top surface of each of the first and second source/drain patterns SD1 and SD2 may be higher than the top surface of the third semiconductor pattern SP3.

The first source/drain patterns SD1 may include a semiconductor element (e.g., SiGe) of which a lattice constant is greater than a lattice constant of a semiconductor element of the substrate 100. Thus, the pair of first source/drain patterns SD1 may provide compressive stress to the first channel pattern CH1 therebetween. The second source/drain patterns SD2 may include the same semiconductor element (e.g., Si) as the substrate 100.

Each of the first source/drain patterns SD1 may include a buffer layer BFL and a main layer MAL on the buffer layer BFL. Referring again to FIG. 4B, the buffer layer BFL may cover an inner surface of the first recess RS1. In some embodiments, the buffer layer BFL may have a substantially uniform thickness. For example, a thickness, in the third direction D3, of the buffer layer BFL on a bottom of the first recess RS1 may be substantially equal to a thickness, in the second direction D2, of the buffer layer BFL on an inner sidewall of an upper portion of the first recess RS1.

In certain embodiments, a thickness of the buffer layer BFL may become smaller in a direction from a lower portion of the buffer layer BFL toward an upper portion of the buffer layer BFL. For example, a thickness, in the third direction D3, of the buffer layer BFL on the bottom of the first recess RS1 may be greater than a thickness, in the second direction D2, of the buffer layer BFL on the inner sidewall of the upper portion of the first recess RS1. The buffer layer BFL may have a U-shape along a profile of the first recess RS1.

The main layer MAL may fill most of a portion of a remaining region of the first recess RS1 except the buffer layer BFL. A volume of the main layer MAL may be greater than a volume of the buffer layer BFL. Each of the buffer layer BFL and the main layer MAL may include silicon-germanium (SiGe). More particularly, the buffer layer BFL may contain a relatively low concentration of germanium (Ge). In some embodiments, the buffer layer BFL may contain more silicon (Si) than germanium (Ge). A concentration of germanium (Ge) of the buffer layer BFL may range from 0 at % to 10 at %.

The main layer MAL may contain a relatively high concentration of germanium (Ge). For example, a concentration of germanium (Ge) in the main layer MAL may range from 30 at % to 70 at %. The concentration of germanium (Ge) in the main layer MAL may increase toward the third direction D3. For example, the main layer MAL adjacent to the buffer layer BFL may have a germanium (Ge) concentration of about 40 at %, and an upper portion of the main layer MAL may have a germanium (Ge) concentration of about 60 at %.

Each of the buffer layer BFL and the main layer MAL may include dopants (e.g., boron, gallium, or indium) for allowing the first source/drain pattern SD1 to be a p-type. A concentration of the dopants of each of the buffer layer BFL and the main layer MAL may range from 1E18 atom/cm$^3$ to 5E22 atom/cm$^3$. The concentration of the dopants in the main layer MAL may be greater than the concentration of the dopants in the buffer layer BFL.

The buffer layer BFL may prevent a stacking fault between the substrate 100 (i.e., the first active pattern AP1) and the main layer MAL and between the main layer MAL and the first to third semiconductor patterns SP1, SP2 and SP3. If a stacking fault were to occur, a channel resistance could be increased. The buffer layer BFL may protect the main layer MAL during a process of replacing second semiconductor layers SAL with first to third inner electrodes PO1, PO2 and PO3 of a gate electrode GE. For example, the buffer layer BFL may prevent an etching material used for removing the second semiconductor layers SAL from permeating into and etching the main layer MAL.

Each of the second source/drain patterns SD2 may include silicon (Si). The second source/drain pattern SD2 may further include dopants (e.g., phosphorus, arsenic, or antimony) that allow the second source/drain pattern SD2 to have an n-type conductivity. A concentration of the dopants of the second source/drain pattern SD2 may range from 1E18 atom/cm$^3$ to 5E22 atom/cm$^3$.

Gate electrodes GE may extend in the first direction D1 to intersect the first and second channel patterns CH1 and CH2. The gate electrodes GE may be arranged in the second direction D2. Each of the gate electrodes GE may vertically overlap with corresponding one(s) of the first and second channel patterns CH1 and CH2.

Referring again to FIG. 4E, the gate electrode GE may include a first inner electrode PO1 disposed between the active pattern AP1 or AP2 and the first semiconductor pattern SP1, a second inner electrode PO2 disposed between the first semiconductor pattern SP1 and the second semiconductor pattern SP2, a third inner electrode PO3 disposed between the second semiconductor pattern SP2 and the third semiconductor pattern SP3, and an outer electrode PO4 on the third semiconductor pattern SP3.

The gate electrode GE may be provided on a top surface TS, a bottom surface BS and both sidewalls SW of each of the first to third semiconductor patterns SP1, SP2 and SP3. For example, the transistor according to the present embodiments may be a three-dimensional field effect transistor (e.g., a MBCFET or a GAAFET) in which the gate electrode GE three-dimensionally surrounds a channel.

A gate cutting pattern CT may divide the gate electrode GE into two gate electrodes GE adjacent to each other in the first direction D1. For example, the gate cutting pattern CT may be disposed between the two gate electrodes GE aligned with each other in the first direction D1. The gate cutting pattern CT may include an insulating material such as silicon oxide, silicon nitride, or a combination thereof.

Referring again to FIGS. 1, 3A, 3B and 4A to 4E, a pair of gate spacers GS may be disposed on both sidewalls of the outer electrode PO4 of the gate electrode GE, respectively. The gate spacers GS may extend along the gate electrode GE in the first direction D1. Top surfaces of the gate spacers GS may be higher than a top surface of the gate electrode GE. The top surfaces of the gate spacers GS may be coplanar with a top surface of a first interlayer insulating layer 110 to be described below. The gate spacers GS may include at least one of SiCN, SiCON, or SiN. In some implementations, each of the gate spacers GS may include a multi-layer formed of at least two of SiCN, SiCON, or SiN.

A gate capping pattern GP may be provided on the gate electrode GE. The gate capping pattern GP may extend along the gate electrode GE in the first direction D1. The gate capping pattern GP may include a material having an etch selectivity with respect to first and second interlayer insulating layers 110 and 120 to be described below. For example, the gate capping pattern GP may include at least one of SiON, SiCN, SiCON, or SiN.

A gate insulating layer GI may be disposed between the gate electrode GE and the first channel pattern CH1 and between the gate electrode GE and the second channel pattern CH2. The gate insulating layer GI may cover the top surface TS, the bottom surface BS and the both sidewalls SW of each of the first to third semiconductor patterns SP1, SP2 and SP3. The gate insulating layer GI may cover a top surface of the device isolation layer ST under the gate electrode GE.

In some embodiments, the gate insulating layer GI may include a silicon oxide layer, a silicon oxynitride layer, and/or a high-k dielectric layer. The high-k dielectric layer may include a high-k dielectric material of which a dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern, and a second metal pattern on the first metal pattern. The first metal pattern may be provided on the gate insulating layer GI and may be adjacent to the first to third semiconductor patterns SP1, SP2 and SP3. The first metal pattern may include a work function metal of adjusting a threshold voltage of a transistor. A desired threshold voltage of the transistor may be obtained by adjusting a thickness and a composition of the first metal pattern. For example, the first to third inner electrodes PO1, PO2 and PO3 of the gate electrode GE may be formed of the first metal pattern corresponding to the work function metal.

The first metal pattern may include a metal nitride layer. For example, the first metal pattern may include nitrogen (N) and at least one metal selected from a group consisting of titanium (Ti), tantalum (Ta), aluminum (Al), tungsten (W), and molybdenum (Mo). In addition, the first metal pattern may further include carbon (C). In some embodiments, the first metal pattern may include a plurality of stacked work function metal layers.

The second metal pattern may include a metal having a resistance lower than that of the first metal pattern. For example, the second metal pattern may include at least one metal selected from a group consisting of tungsten (W), aluminum (Al), titanium (Ti), and tantalum (Ta). For example, the outer electrode PO4 of the gate electrode GE may include the first metal pattern and the second metal pattern on the first metal pattern.

Referring again to FIG. 4A, inner spacers IP may be provided on the second active pattern AP2. The inner spacers IP may be disposed between the second source/drain pattern SD2 and the first to third inner electrodes PO1, PO2 and PO3 of the gate electrode GE, respectively. The inner spacers IP may be in direct contact with the second source/drain pattern SD2. Each of the first to third inner electrodes PO1, PO2 and PO3 of the gate electrode GE may be spaced apart from the second source/drain pattern SD2 by the inner spacer IP.

A first interlayer insulating layer 110 may be provided on the first surface 100A of the substrate 100. The first interlayer insulating layer 110 may cover the gate spacers GS and the first and second source/drain patterns SD1 and SD2. A top surface of the first interlayer insulating layer 110 may be substantially coplanar with the top surface of the gate capping pattern GP and the top surface of the gate spacer GS. A second interlayer insulating layer 120 covering the gate capping pattern GP may be disposed on the first interlayer insulating layer 110. A third interlayer insulating layer 130 may be provided on the second interlayer insulating layer 120. A fourth interlayer insulating layer 140 may be provided on the third interlayer insulating layer 130. For example, each of the first to fourth interlayer insulating layers 110 to 140 may include a silicon oxide layer.

Active contacts AC may penetrate the first and second interlayer insulating layers 110 and 120 so as to be connected to the first and second source/drain patterns SD1 and SD2. Top surfaces of the active contacts AC may be substantially coplanar with a top surface of the second interlayer insulating layer 120. The active contact AC may be a self-aligned contact. In other words, the active contact AC may be formed to be self-aligned by the gate capping pattern GP and the gate spacer GS. For example, the active contact AC may cover at least a portion of a sidewall of the gate capping pattern GP.

A metal-semiconductor compound layer SC (e.g., a silicide layer) may be disposed between the active contact AC and the source/drain pattern SD1 or SD2 connected thereto. The active contact AC may be electrically connected to the source/drain pattern SD1 or SD2 through the metal-semiconductor compound layer SC. For example, the metal-semiconductor compound layer SC may include at least one of titanium silicide, tantalum silicide, tungsten silicide, nickel silicide, or cobalt silicide.

A first via VI1 may be provided on a top surface of the active contact AC. The active contact AC may be electrically connected to one of the first and second bit lines BL1 and BL2 of the first metal layer M1, provided in the third interlayer insulating layer 130, through the first via VI1.

Dummy contacts DAC may penetrate the first and second interlayer insulating layers 110 and 120 so as to be connected to some of the first and second source/drain patterns SD1 and SD2. The first via VI1 may be omitted on the dummy contact DAC. For example, the dummy contact DAC may not be electrically connected to the first metal layer M1. In certain embodiments, at least one or all of the dummy contacts DAC may be omitted.

A gate contact GC connected to the gate electrode GE may be provided. The gate contact GC may vertically extend from the top surface of the gate electrode GE to the first metal layer M1. The gate electrode GE may be electrically connected to the word line pad WLP through the gate contact GC.

In some embodiments, the active contact AC may include a conductive pattern FM and a barrier pattern BM surrounding the conductive pattern FM. For example, the conductive pattern FM may include at least one metal of aluminum, copper, tungsten, molybdenum, or cobalt. The barrier pattern BM may cover sidewalls and a bottom surface of the conductive pattern FM. The barrier pattern BM may include a metal nitride layer, or a metal layer/a metal nitride layer.

The metal layer may include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer. In some embodiments, the gate contact GC may also include the conductive pattern FM and the barrier pattern BM.

A second metal layer M2 may be provided in the fourth interlayer insulating layer 140. The second metal layer M2 may include word lines WL extending in the first direction D1. Each of the word lines WL may be electrically connected to the word line pad WLP through a second via VI2.

Backside active contacts BAC and backside gate contacts BGC may be provided on the second surface 100B of the substrate 100. The backside active contact BAC may extend from the second surface 100B to a lower portion of the source/drain pattern SD1 or SD2 in the third direction D3. The backside active contact BAC may be connected to the source/drain pattern SD1 or SD2.

The backside gate contact BGC may extend from the second surface 100B to a lower portion of the gate electrode GE in the third direction D3. The backside gate contact BGC may be connected to the gate electrode GE. Each of the backside active contact BAC and the backside gate contact BGC may include the conductive pattern FM and the barrier pattern BM, like the active contact AC.

In some embodiments, the backside active contacts BAC may include a backside active contact BAC connected to a common source/drain of the first pull-up and first pull-down transistors TU1 and TD1. The backside gate contacts BGC may include a backside gate contact BGC connected to a common gate of the second pull-up and second pull-down transistors TU2 and TD2.

The backside active contact BAC and the backside gate contact BGC may be merged with each other to constitute a shared contact BSC. Referring again to FIG. 4B, the gate electrode GE may be electrically connected to the first source/drain pattern SD1 adjacent thereto through the shared contact BSC. In other words, the shared contact BSC may provide an electrical connection path ECN between the gate electrode GE and the first source/drain pattern SD1. The shared contact BSC may correspond to the first node N1 or the second node N2 of FIG. 1.

According to some embodiments, the shared contact BSC may have the shape in which the backside active contact BAC and the backside gate contact BGC are merged with each other as a single metal contact, as illustrated in FIGS. 4B and 4D. According to certain embodiments, the shared contact BSC may have a shape in which the backside active contact BAC and the backside gate contact BGC are in contact with each other. In other words, an interface between the backside active contact BAC and the backside gate contact BGC may clearly exist.

The shared contact BSC may not be connected to the backside metal layer BSM to be described later. The shared contact BSC may have a L-shape when viewed in a plan view. The shared contact BSC may electrically connect the gate electrode GE and the first source/drain pattern SD1 which are adjacent to each other in the second direction D2 (see FIG. 4B). The shared contact BSC may electrically connect the first and second source/drain patterns SD1 and SD2 adjacent to each other in the first direction D1 (see FIG. 4D). In other words, the shared contact BSC may be provided as the L-shape to electrically connect the first source/drain pattern SD1, the second source/drain pattern SD2 and the gate electrode GE to each other.

A MOL layer according to the present embodiments may include only the active contacts AC, the dummy contacts DAC and the gate contacts GC, illustrated in FIG. 3A. In other words, the shared contact BSC may be omitted in the MOL layer. Since the shared contact BSC is omitted in the MOL layer, a congestion degree of the contacts in the MOL layer may be reduced. In addition, sizes of the contacts in the MOL layer may be increased to reduce resistances in the MOL layer.

The backside metal layer BSM may be provided on the second surface 100B of the substrate 100. As described with reference to FIG. 2, the backside metal layer BSM may include the ground lines VSS and the power lines VDD, which extend in the second direction D2. A lower insulating layer LIL may be provided between the second surface 100B and the ground and power lines VSS and VDD.

Referring again to FIG. 4C, each of some of the backside active contacts BAC may be electrically connected to one of the ground and power lines VSS and VDD through a lower via BVI. The ground line VSS may be electrically connected to a corresponding one of the second source/drain patterns SD2 through a corresponding one of the backside active contacts BAC. The power line VDD may be electrically connected to a corresponding one of the first source/drain patterns SD1 through a corresponding one of the backside active contacts BAC.

A power delivery network layer PDN may be provided under the backside metal layer BSM. The power delivery network layer PDN may include a plurality of lower interconnection lines electrically connected to the ground and power lines VSS and VDD. For example, the power delivery network layer PDN may include an interconnection network for applying a ground voltage to the ground lines VSS. The power delivery network layer PDN may include an interconnection network for applying a power voltage to the power lines VDD.

According to embodiments, power interconnection lines for supplying the ground voltage and the power voltage to the bit cells CE1 to CE4 may be disposed under the substrate 100 in the form of the power delivery network layer PDN. Thus, the power interconnection lines may be omitted in the BEOL layer including the first metal layer M1. When the power interconnection lines are omitted in the BEOL layer, a degree of congestion with interconnection lines in the BEOL layer may be reduced. In addition, sizes of the interconnection lines in the BEOL layer may be increased to reduce resistances in the BEOL layer.

FIGS. 5A to 10C are cross-sectional views illustrating a method of manufacturing a semiconductor memory device according to some embodiments. FIGS. 5A, 6A, 7A, 8A and 9A are cross-sectional views taken along the lines A-A' of FIGS. 3A and 3B. FIGS. 5B, 6B, 7B, 8B, 9B and 10A are cross-sectional views taken along the lines B-B' of FIGS. 3A and 3B. FIGS. 7C, 9C and 10B are cross-sectional views taken along the lines C-C' of FIGS. 3A and 3B. FIGS. 5C, 6C, 8C, 9D and 10C are cross-sectional views taken along the lines E-E' of FIGS. 3A and 3B.

Figure 5A:
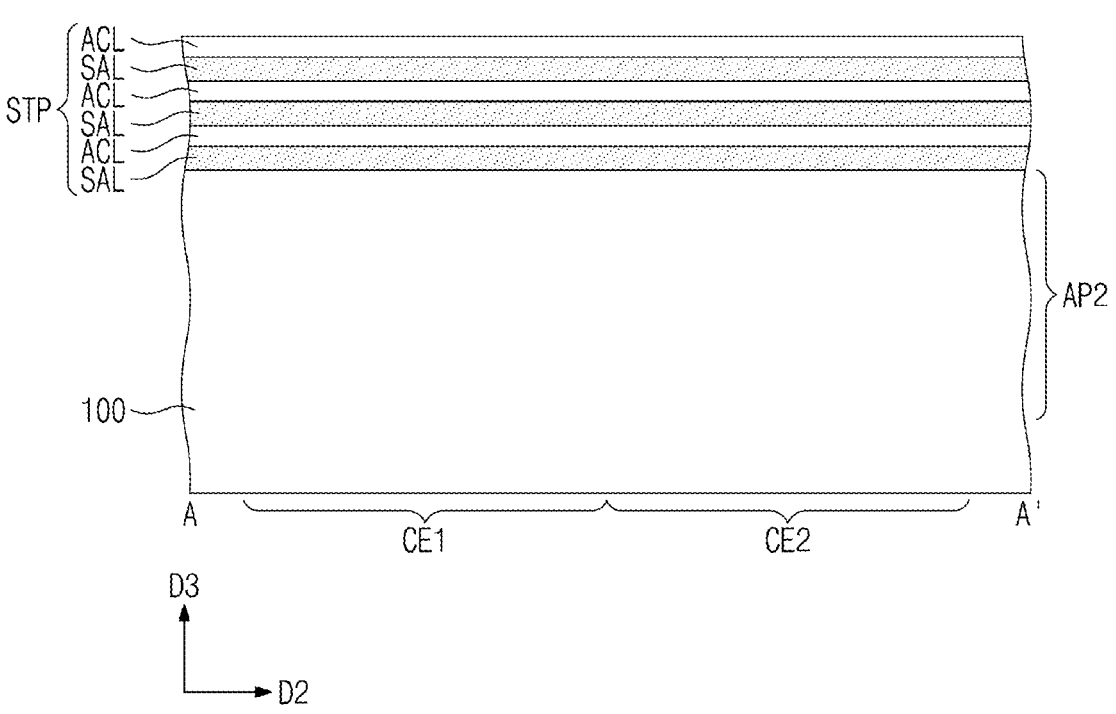
FIGS. 5A to 10C are cross-sectional views illustrating a method of manufacturing a semiconductor memory device according to some embodiments.
Figure 5B:
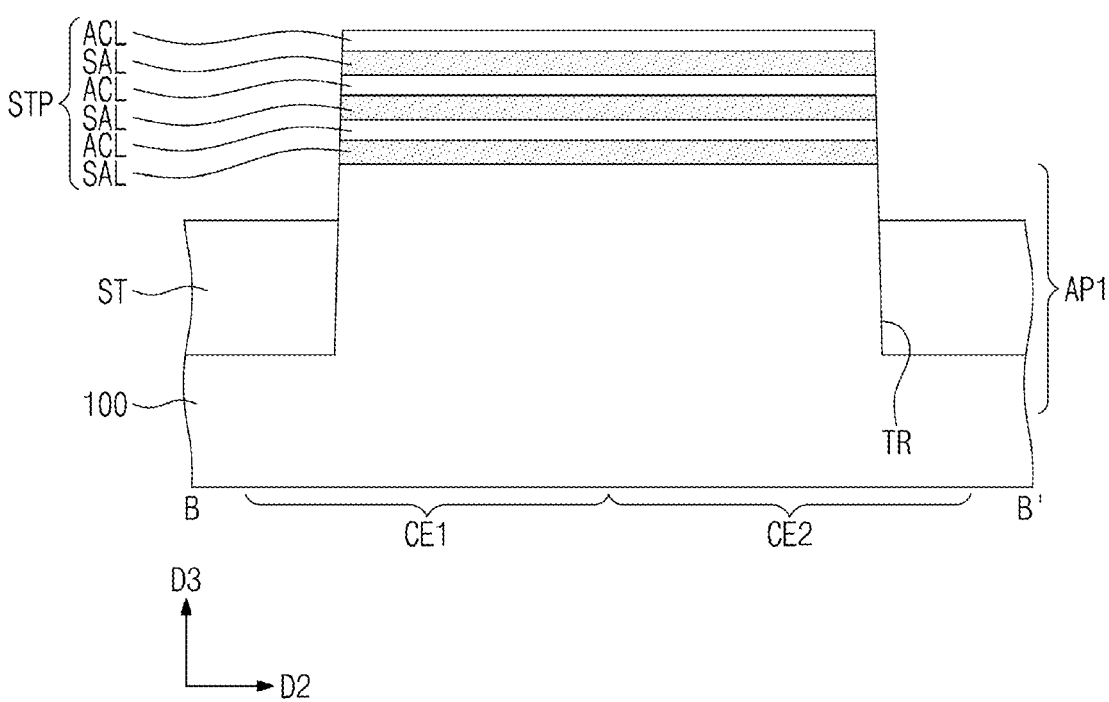
Figure 5C:
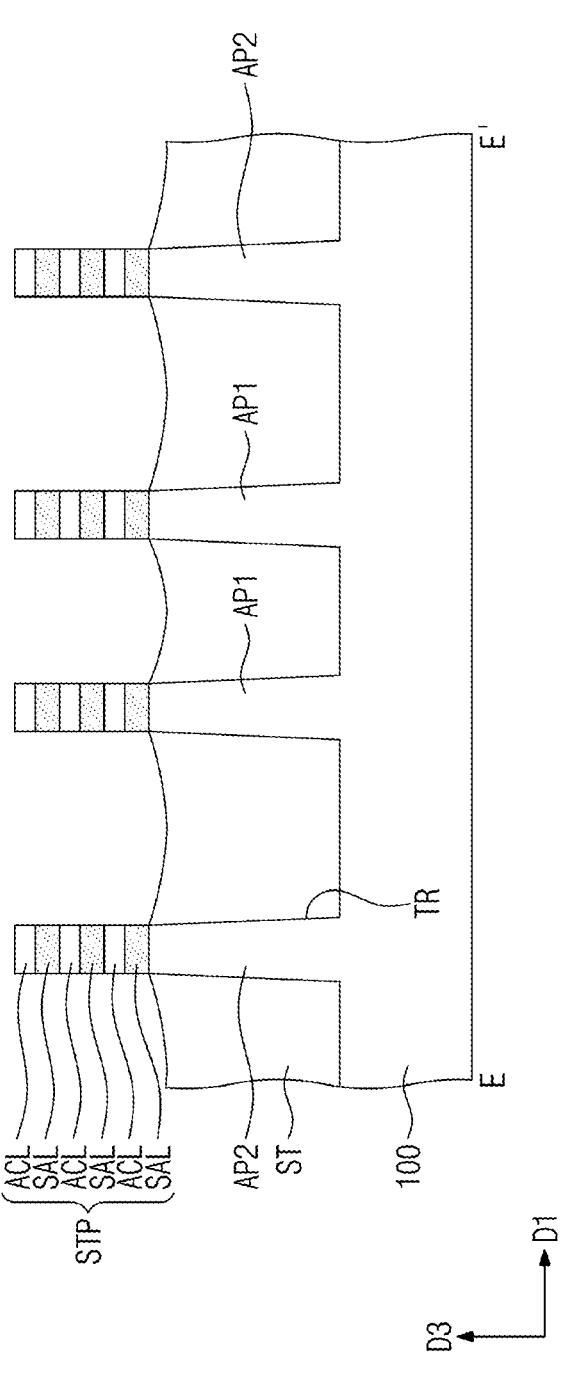

Referring to FIGS. 5A to 5C, a substrate 100 including first to fourth bit cells CE1 to CE4 may be provided. First semiconductor layers ACL and second semiconductor layers SAL may be alternately formed on the substrate 100. The first semiconductor layers ACL may include one of silicon (Si), germanium (Ge) and silicon-germanium (SiGe), and the second semiconductor layers SAL may include another of silicon (Si), germanium (Ge) and silicon-germanium (SiGe).

The second semiconductor layer SAL may include a material having an etch selectivity with respect to the first semiconductor layer ACL. For example, the first semiconductor layers ACL may include silicon (Si), and the second semiconductor layers SAL may include silicon-germanium (SiGe). A concentration of germanium (Ge) of each of the second semiconductor layers SAL may range from 10 at % to 30 at %. Mask patterns may be formed on the first to fourth bit cells CE1 to CE4 of the substrate 100. Each of the mask patterns may have a line shape or bar shape extending in the second direction D2.

A patterning process may be performed using the mask patterns as etch masks to form a trench TR defining first active patterns AP1 and second active patterns AP2. For example, the trench TR may be formed between the first and second active patterns AP1 and AP2. The first and second active patterns AP1 and AP2 may have bar shapes extending in the second direction D2 in parallel to each other when viewed in a plan view.

A stack pattern STP may be formed on each of the first and second active patterns AP1 and AP2. The stack pattern STP may include the first semiconductor layers ACL and the second semiconductor layers SAL, which are alternately stacked. The stack patterns STP may be formed together with the first and second active patterns AP1 and AP2 in the patterning process.

A device isolation layer ST filling the trench TR may be formed. For example, an insulating layer covering the first and second active patterns AP1 and AP2 and the stack patterns STP may be formed on an entire top surface of the substrate 100. The insulating layer may be recessed until the stack patterns STP are exposed, thereby forming the device isolation layer ST.

The device isolation layer ST may include an insulating material (e.g., silicon oxide). The stack patterns STP may be exposed above the device isolation layer ST. In other words, the stack patterns STP may vertically protrude above the device isolation layer ST.

Figure 6A:
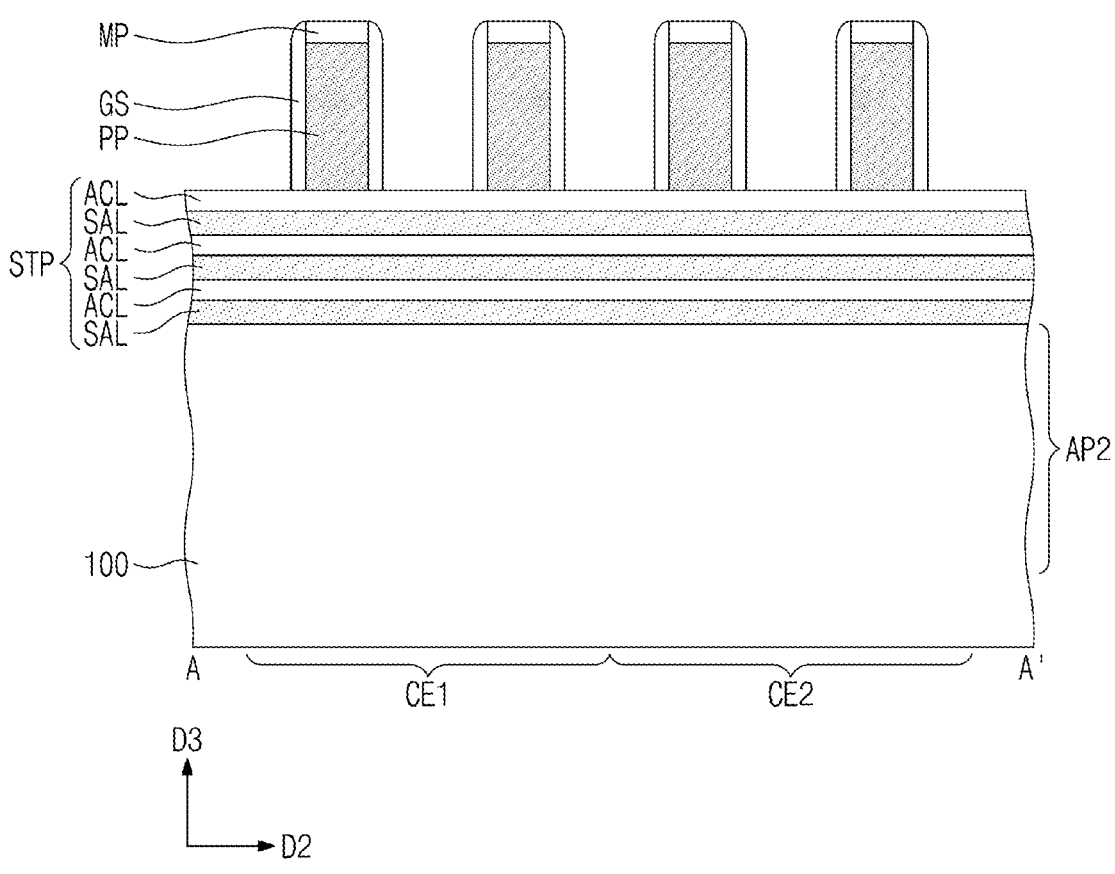
Figure 6B:
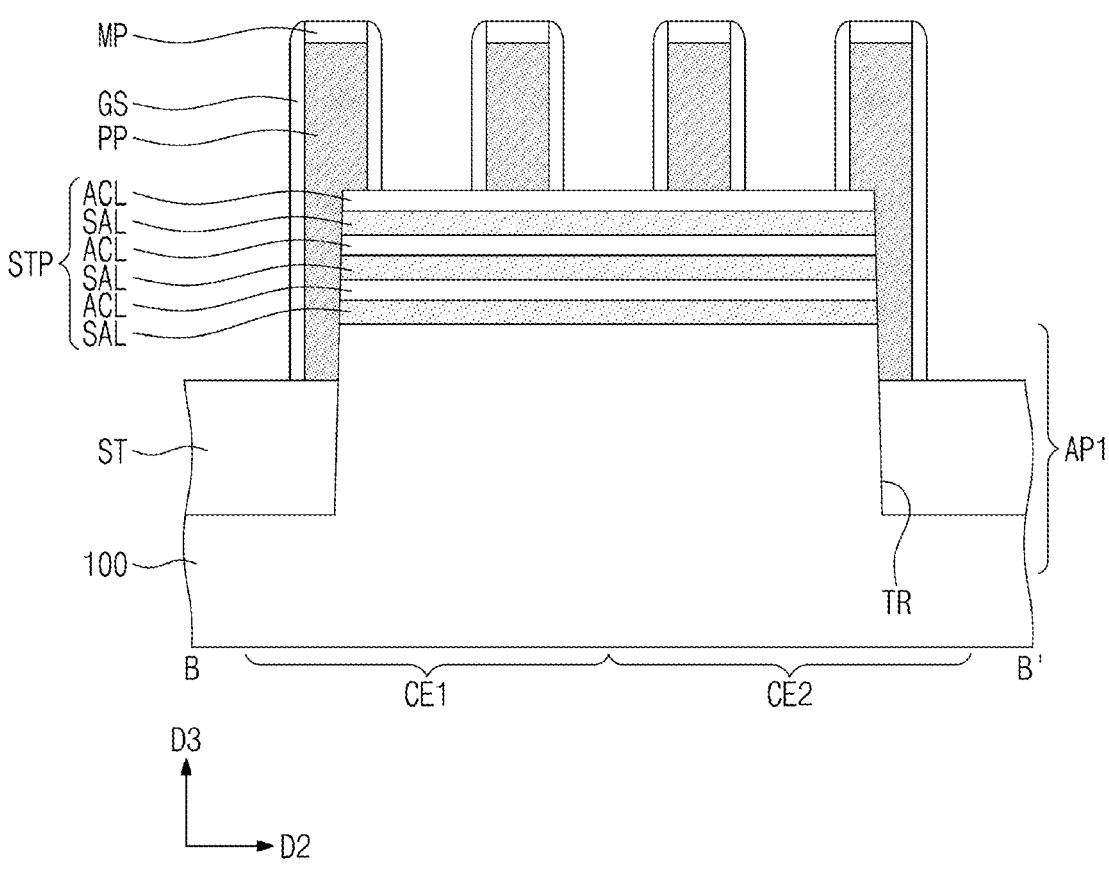
Figure 6C:
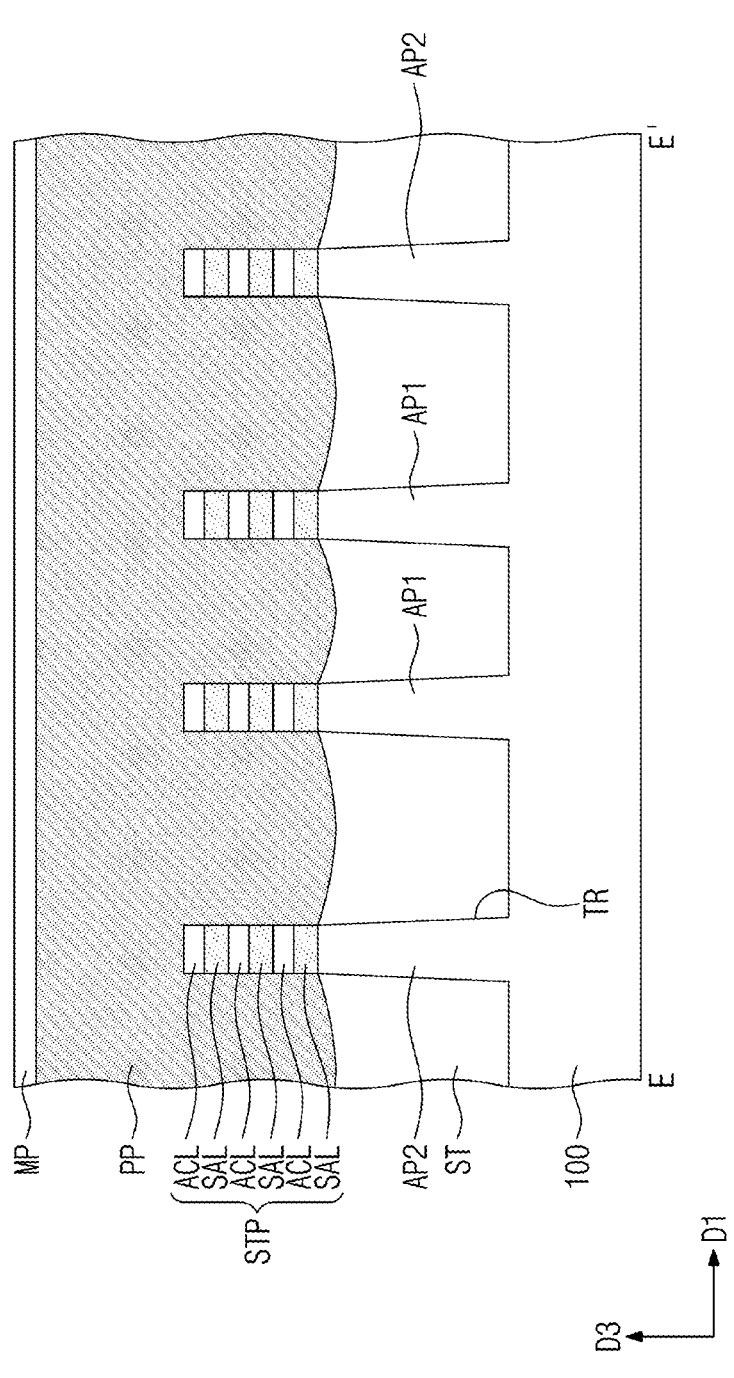

Referring to FIGS. 6A to 6C, sacrificial patterns PP intersecting the stack patterns STP may be formed on the substrate 100. Each of the sacrificial patterns PP may be formed to have a line shape or bar shape extending in the first direction D1.

For example, the formation of the sacrificial patterns PP may include forming a sacrificial layer on an entire top surface of the substrate 100, forming hard mask patterns MP on the sacrificial layer, and patterning the sacrificial layer using the hard mask patterns MP as etch masks. The sacrificial layer may include poly-silicon.

A pair of gate spacers GS may be formed on both sidewalls of each of the sacrificial patterns PP, respectively. The formation of the gate spacers GS may include conformally forming a gate spacer layer on an entire top surface of the substrate 100, and anisotropically etching the gate spacer layer. The gate spacer layer may include at least one of SiCN, SiCON, or SiN. In certain embodiments, the gate spacer layer may be formed of a multi-layer including at least two of SiCN, SiCON, or SiN.

Figure 7A:
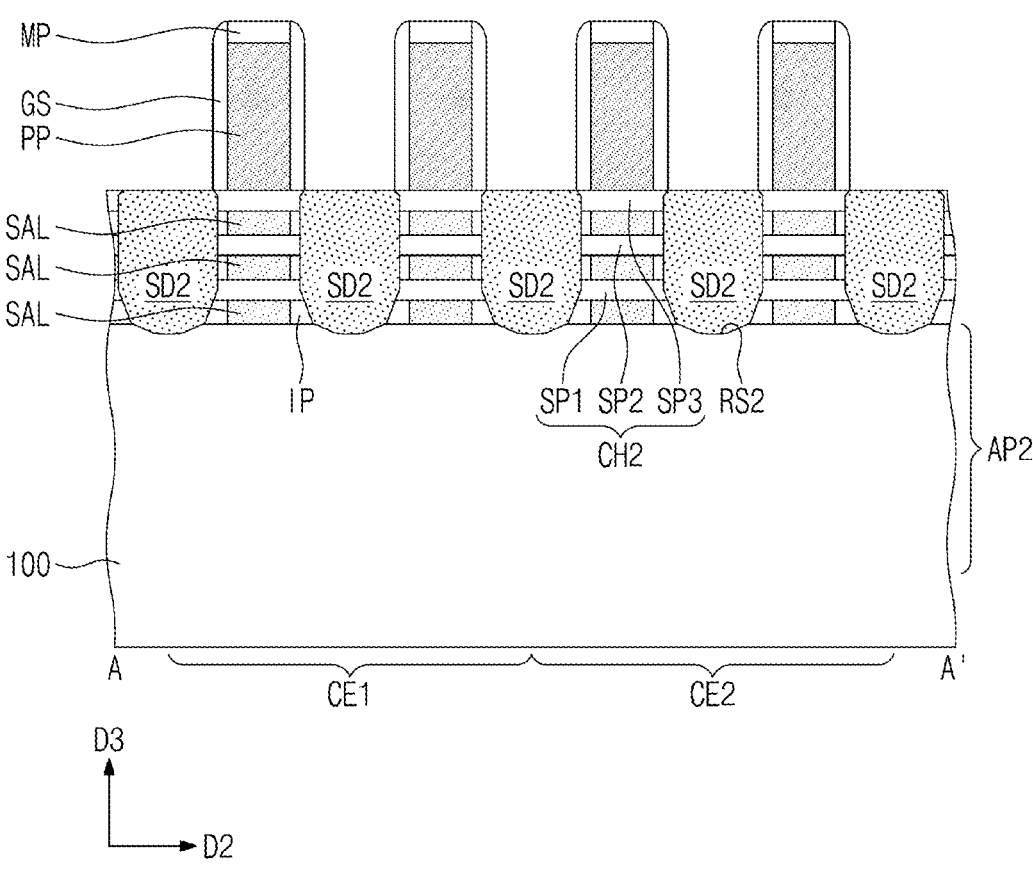
Figure 7B:
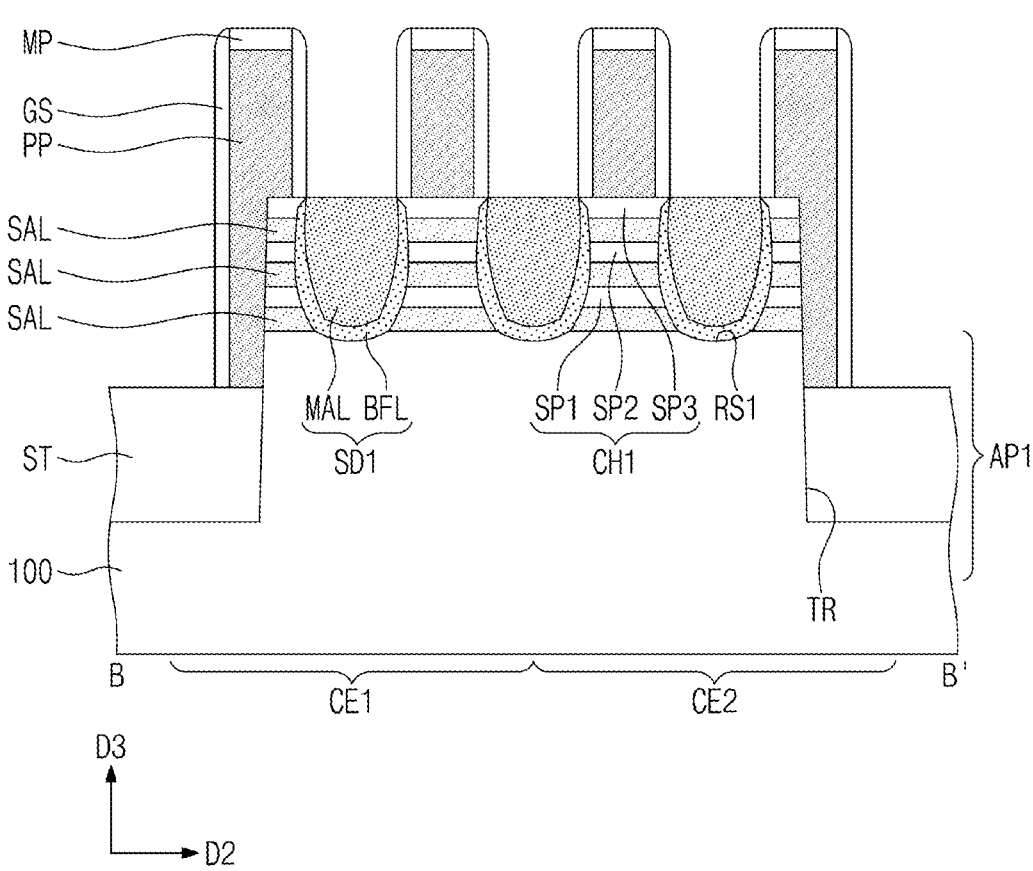
Figure 7C:
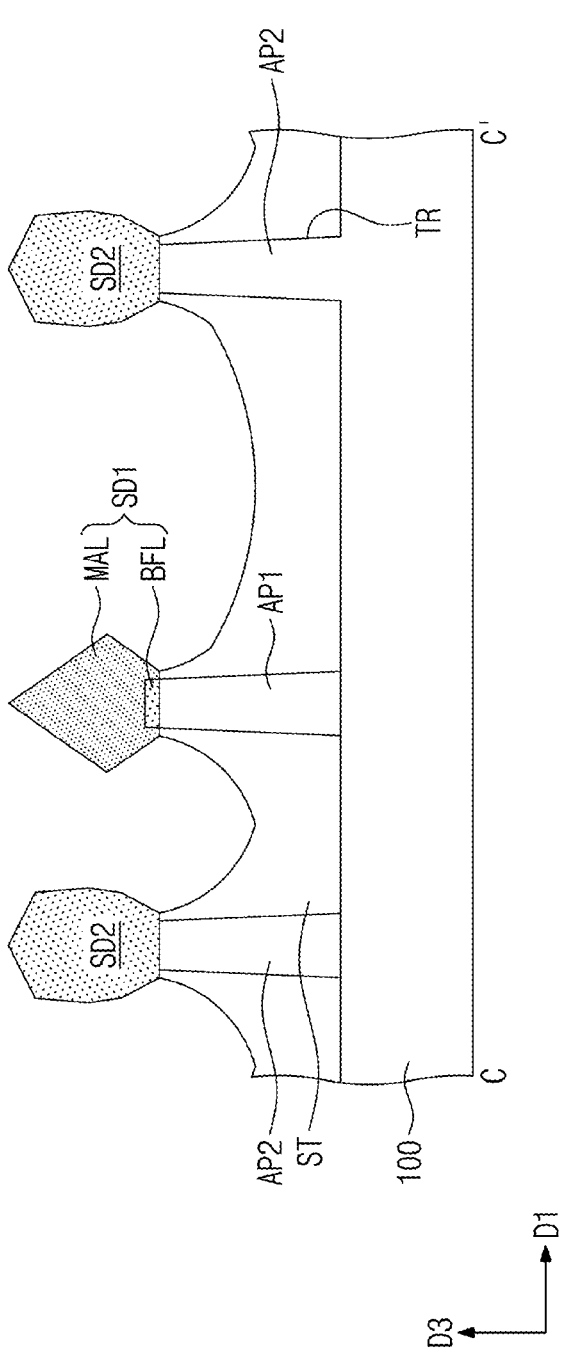

Referring to FIGS. 7A to 7C, first recesses RS1 may be formed in the stack pattern STP on the first active pattern AP1. Second recesses RS2 may be formed in the stack pattern STP on the second active pattern AP2. The device isolation layer ST at both sides of each of the first and second active patterns AP1 and AP2 may be further recessed during the formation of the first and second recesses RS1 and RS2 (see FIG. 7C).

More particularly, the stack pattern STP on the first active pattern AP1 may be etched using the hard mask patterns MP and the gate spacers GS as etch masks to form the first recesses RS1. The first recess RS1 may be formed between a pair of the sacrificial patterns PP. The second recesses RS2 in the stack pattern STP on the second active pattern AP2 may be formed by the same method as the first recesses RS1.

First to third semiconductor patterns SP1, SP2 and SP3 stacked sequentially may be formed from the first semiconductor layers ACL between the first recesses RS1 adjacent to each other. First to third semiconductor patterns SP1, SP2 and SP3 stacked sequentially may be formed from the first semiconductor layers ACL between the second recesses RS2 adjacent to each other. The first to third semiconductor patterns SP1, SP2 and SP3 between the first recesses RS1 adjacent to each other may constitute a first channel pattern CH1. The first to third semiconductor patterns SP1, SP2 and SP3 between the second recesses RS2 adjacent to each other may constitute a second channel pattern CH2.

First source/drain patterns SD1 may be formed in the first recesses RS1, respectively. For example, a first selective epitaxial growth (SEG) process may be performed using an inner surface of the first recess RS1 as a seed layer to form a buffer layer BFL. The buffer layer BFL may be grown using the first to third semiconductor patterns SP1, SP2 and SP3 and the substrate 100 exposed by the first recess RS1 as a seed. For example, the first SEG process may include a chemical vapor deposition (CVD) process or a molecular beam epitaxy (MBE) process.

The buffer layer BFL may include a semiconductor element (e.g., SiGe) of which a lattice constant is greater than a lattice constant of a semiconductor element of the substrate 100. The buffer layer BFL may contain a relatively low concentration of germanium (Ge). In certain embodiments, the buffer layer BFL may contain silicon (Si) except germanium (Ge). A concentration of germanium (Ge) of the buffer layer BFL may range from 0 at % to 10 at %.

A second SEG process may be performed on the buffer layer BFL to form a main layer MAL. The main layer MAL may be formed to completely or almost fill the first recess RS1. The main layer MAL may contain a relatively high concentration of germanium (Ge). For example, a concentration of germanium (Ge) of the main layer MAL may range from 30 at % to 70 at %.

In some embodiments, a third SEG process may be performed on the main layer MAL to form a capping layer. The capping layer may include silicon (Si). A concentration of silicon (Si) of the capping layer may range from 98 at % to 100 at %.

Dopants (e.g., boron, gallium or indium) for allowing the first source/drain pattern SD1 to have a p-type may be injected in-situ during the formation of the buffer layer BFL and the main layer MAL. In some implementations, after the formation of the first source/drain pattern SD1, the dopants may be injected or implanted into the first source/drain pattern SD1.

Second source/drain patterns SD2 may be formed in the second recesses RS2, respectively. For example, the second source/drain pattern SD2 may be formed by performing a SEG process using an inner surface of the second recess RS2 as a seed layer. For example, the second source/drain pattern SD2 may include the same semiconductor element (e.g., Si) as the substrate 100.

Dopants (e.g., phosphorus, arsenic or antimony) for allowing the second source/drain pattern SD2 to have an n-type may be injected in-situ during the formation of the second source/drain pattern SD2. In some implementations, after the formation of the second source/drain pattern SD2, the dopants may be injected or implanted into the second source/drain pattern SD2.

In some embodiments, before the formation of the second source/drain pattern SD2, portions of the second semiconductor layers SAL exposed by the second recess RS2 may be replaced with an insulating material to form inner spacers IP. As a result, the inner spacers IP may be formed between the second source/drain pattern SD2 and the second semiconductor layers SAL, respectively.

Figure 8A:
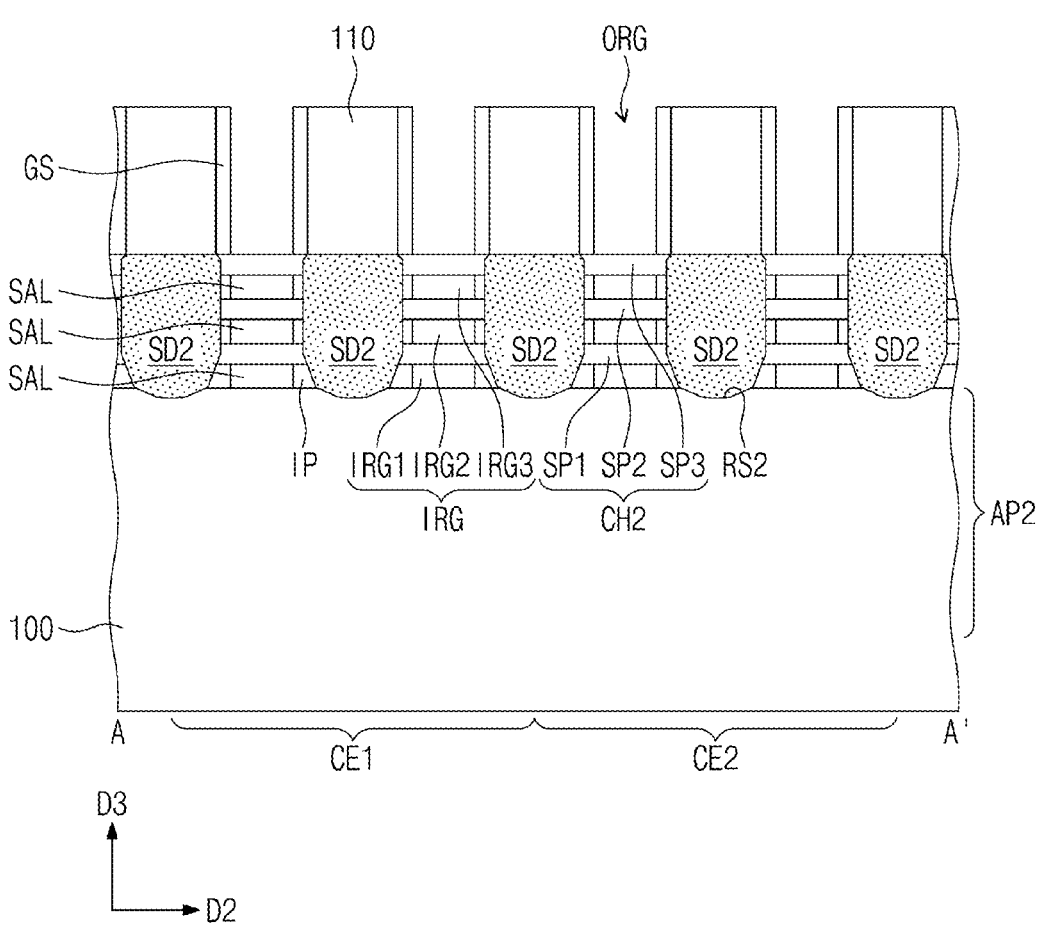
Figure 8B:
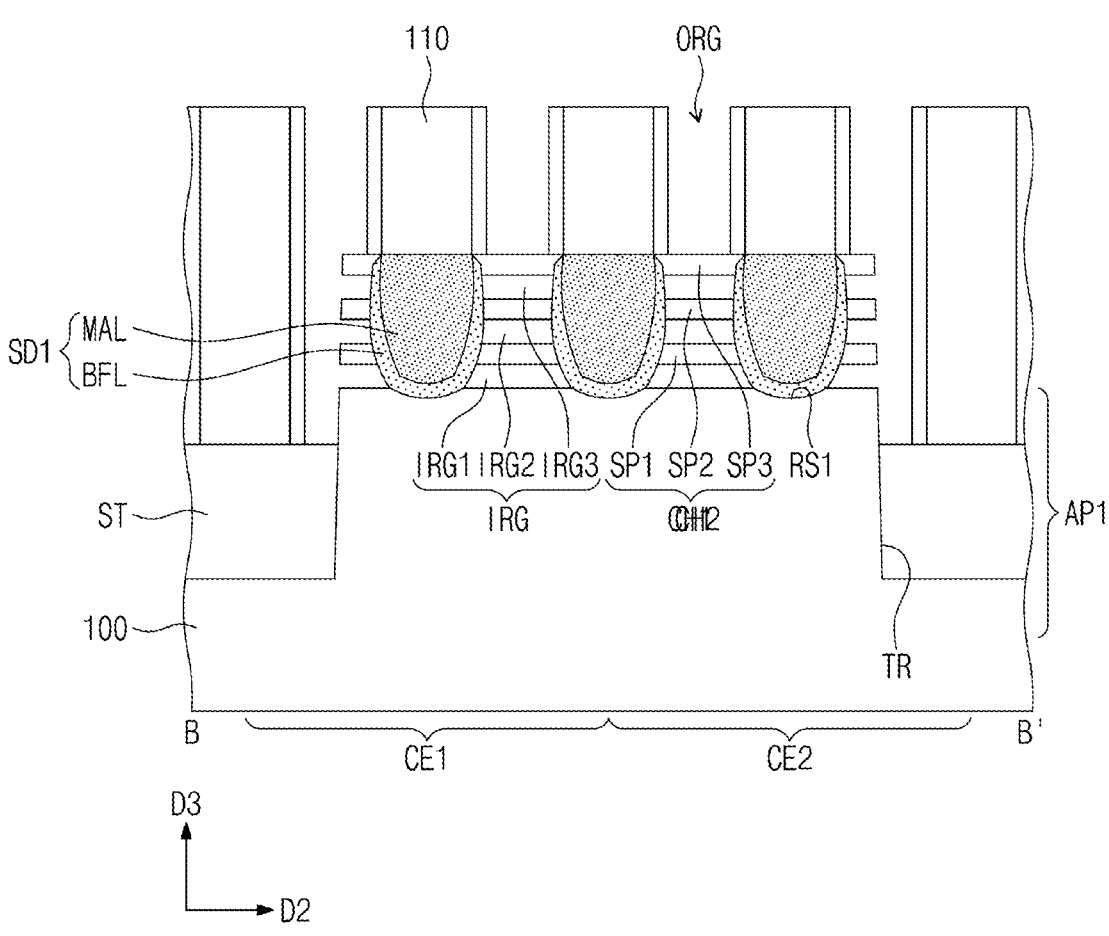
Figure 8C:
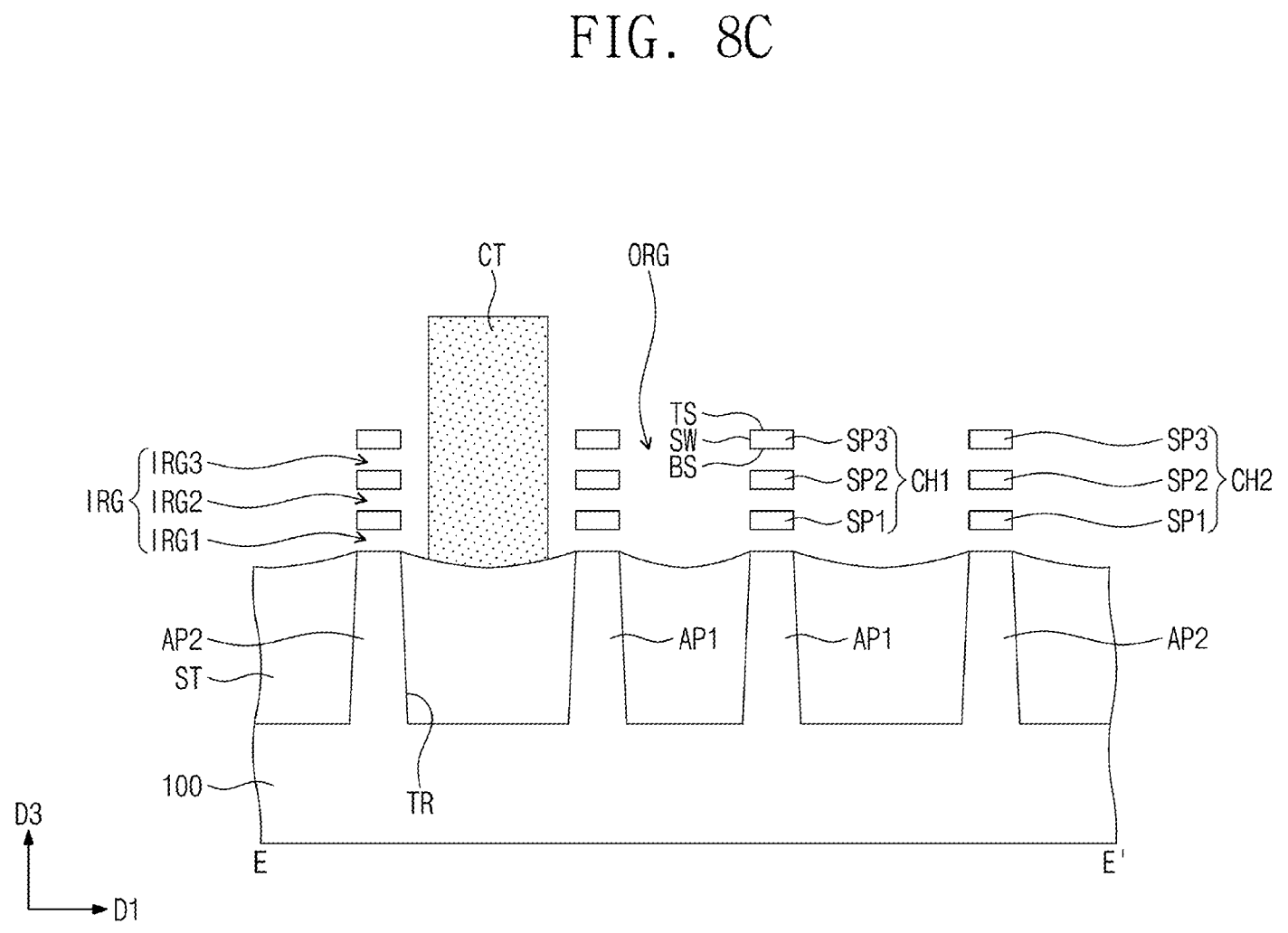
Figure 9A:
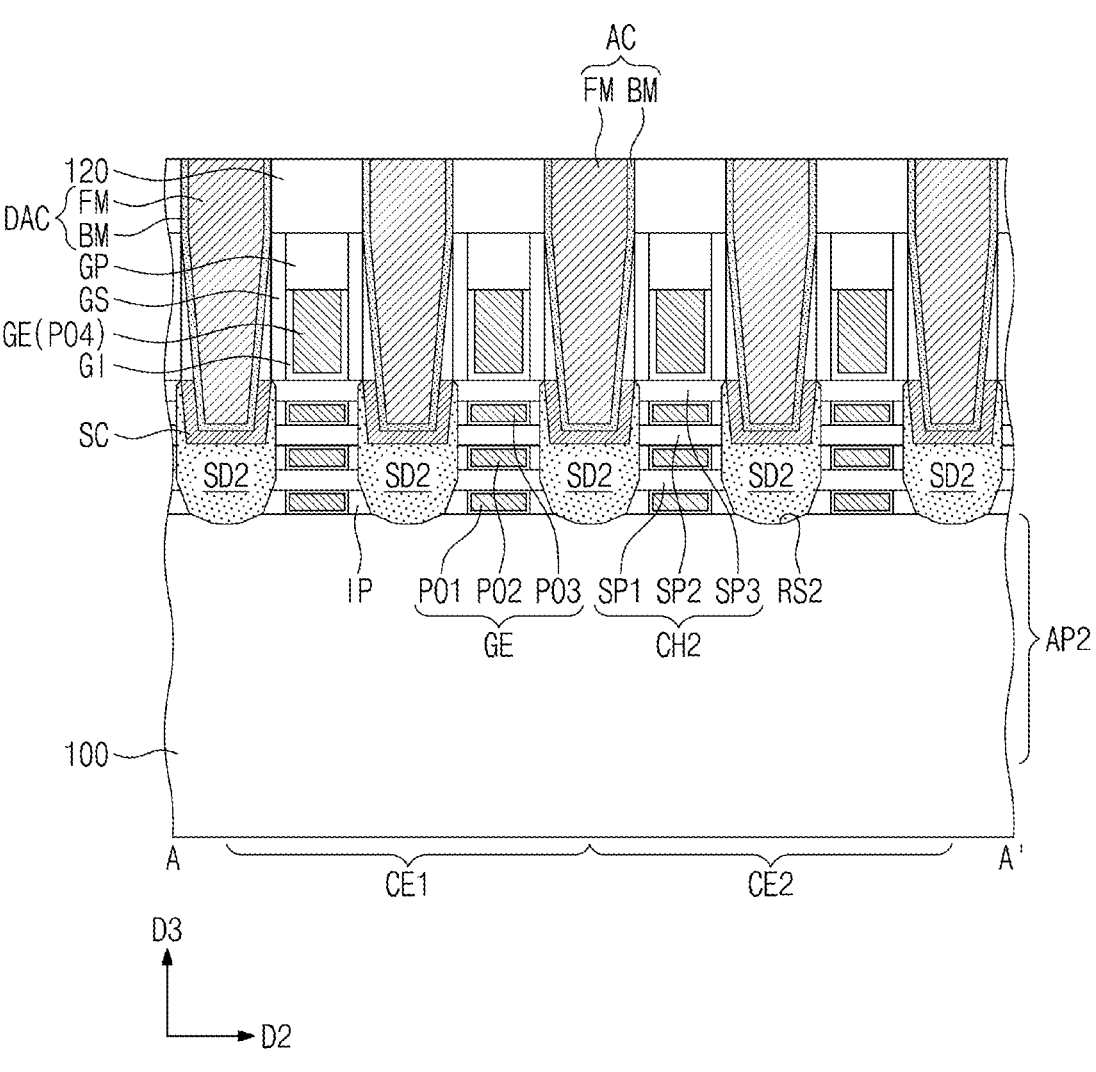
Figure 9B:
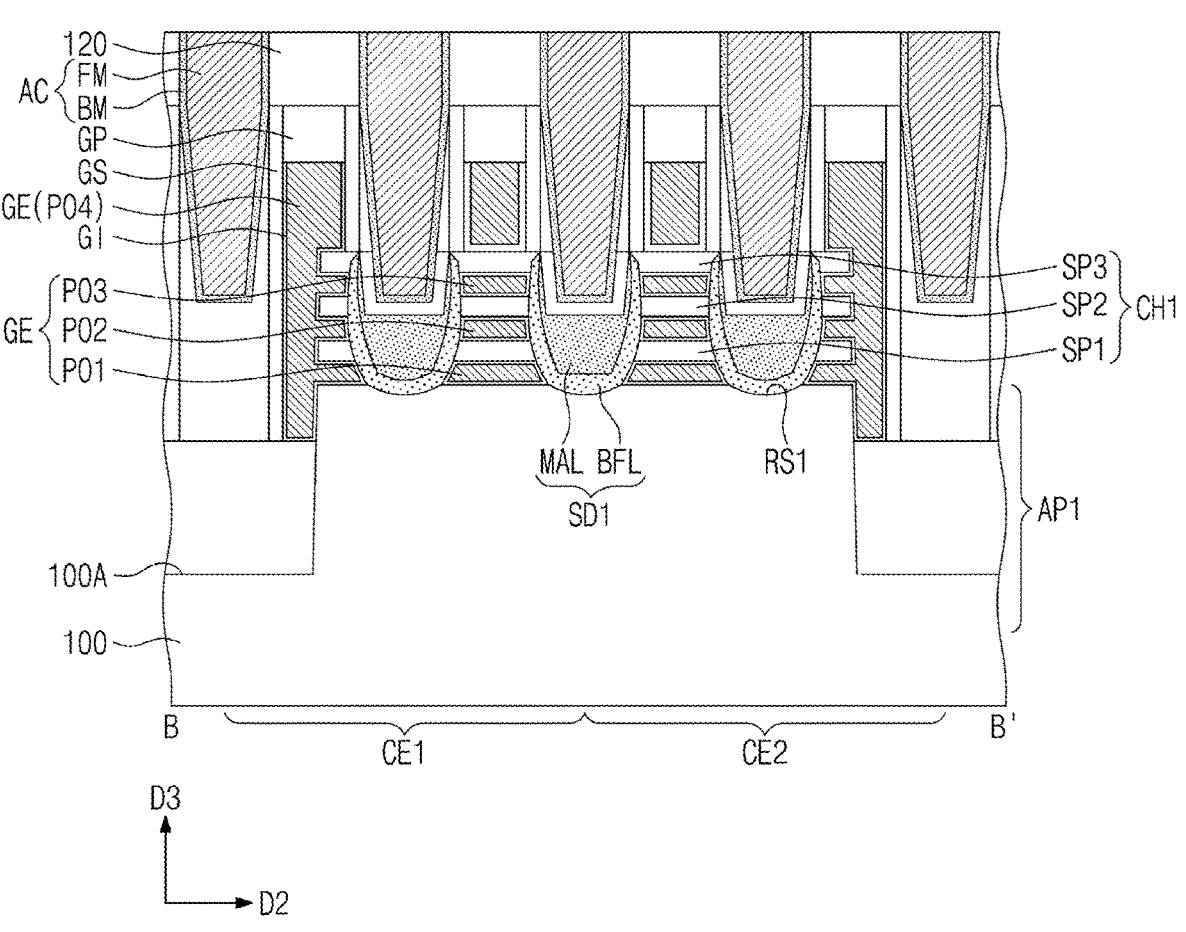
Figure 9C:
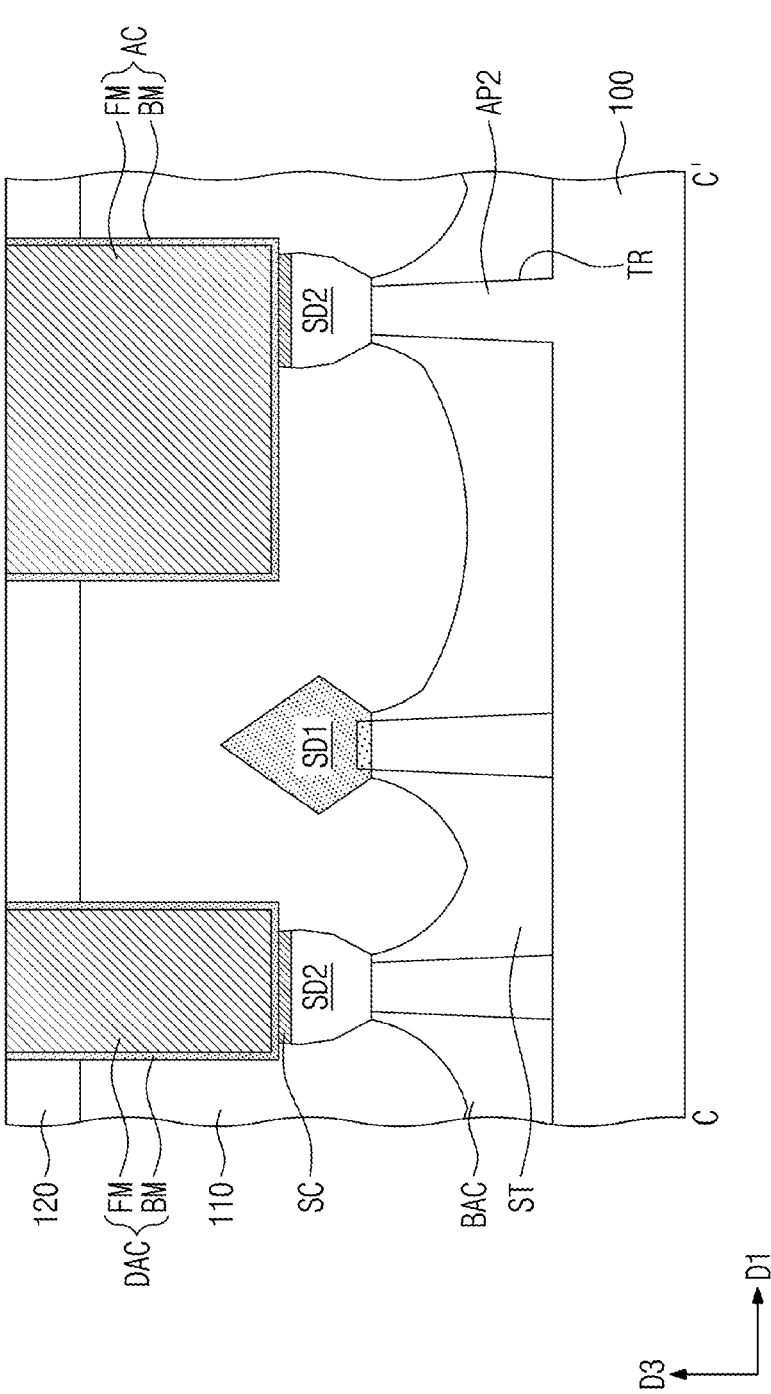
Figure 9D:
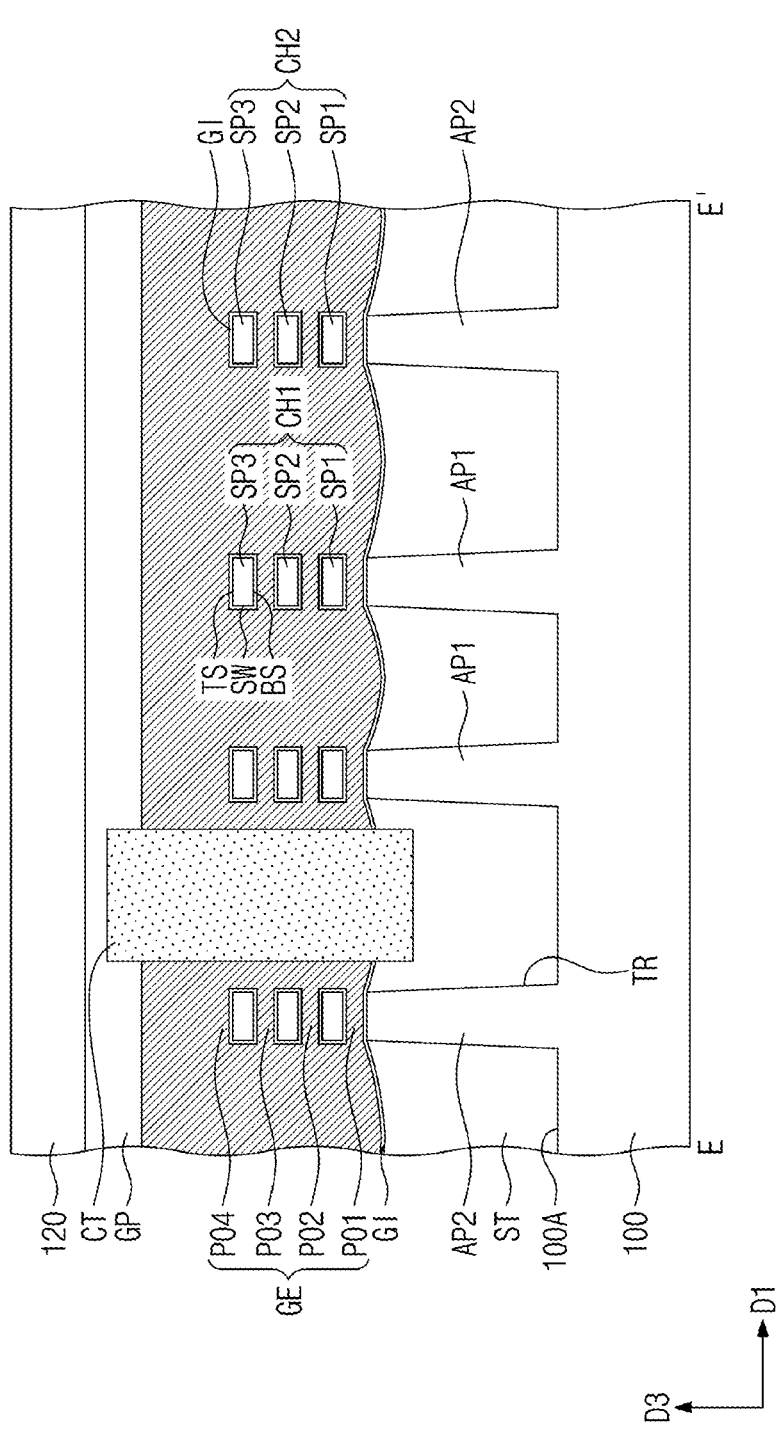

Referring to FIGS. 8A to 8C, a first interlayer insulating layer 110 may be formed to cover the first and second source/drain patterns SD1 and SD2, the hard mask patterns MP and the gate spacers GS. For example, the first interlayer insulating layer 110 may include a silicon oxide layer.

The first interlayer insulating layer 110 may be planarized to expose top surfaces of the sacrificial patterns PP. The planarization of the first interlayer insulating layer 110 may be performed using an etch-back process or a chemical mechanical polishing (CMP) process. The hard mask patterns MP may be completely removed during the planarization process. As a result, a top surface of the first interlayer insulating layer 110 may be substantially coplanar with the top surfaces of the sacrificial patterns PP and top surfaces of the gate spacers GS.

A region of the sacrificial pattern PP may be selectively opened using a photolithography process. For example, a region of the sacrificial pattern PP between the first and second active patterns AP1 and AP2 adjacent to each other may be selectively opened. The opened region of the sacrificial pattern PP may be selectively etched and thus may be removed. A space formed by the removal of the sacrificial pattern PP may be filled with an insulating material to form a gate cutting pattern CT (see FIG. 8C).

Remaining exposed portions of the sacrificial patterns PP may be selectively removed. Outer regions ORG exposing the first and second channel patterns CH1 and CH2 may be formed by the removal of the sacrificial patterns PP (see FIG. 8C). The removal of the sacrificial patterns PP may include performing a wet etching process using an etching solution capable of selectively etching poly-silicon.

The second semiconductor layers SAL exposed through the outer region ORG may be selectively removed to form inner regions IRG (see FIG. 8C). For example, an etching process of selectively etching the second semiconductor layers SAL may be performed to remove the second semiconductor layers SAL while leaving the first to third semiconductor patterns SP1, SP2 and SP3. The etching process may have a high etch rate with respect to silicon-germanium having a relatively high germanium concentration. For example, the etching process may have a high etch rate with respect to silicon-germanium having a germanium concentration greater than 10 at %. Meanwhile, the first source/drain pattern SD1 may be protected by the buffer layer BFL having a relatively low concentration of germanium during the etching process.

Referring again to FIG. 8C, when the second semiconductor layers SAL are selectively removed, the first to third semiconductor patterns SP1, SP2 and SP3 stacked sequentially may remain on each of the first and second active patterns AP1 and AP2. First to third inner regions IRG1, IRG2 and IRG3 may be formed by the removal of the second semiconductor layers SAL.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 9A to 9D, a gate insulating layer GI may be conformally formed on the exposed first to third semiconductor patterns SP1, SP2 and SP3. A gate electrode GE may be formed on the gate insulating layer GI. The gate electrode GE may include first to third inner electrodes PO1, PO2 and PO3 formed in the first to third inner regions IRG1, IRG2 and IRG3, respectively, and an outer electrode PO4 formed in the outer region ORG.

The gate electrode GE may be recessed to reduce its height. An upper portion of the gate cutting pattern CT may also be slightly recessed during the recessing of the gate electrode GE. A gate capping pattern GP may be formed on the recessed gate electrode GE.

A second interlayer insulating layer 120 may be formed on the first interlayer insulating layer 110. The second interlayer insulating layer 120 may include a silicon oxide layer. Active contacts AC may be formed to penetrate the second interlayer insulating layer 120 and the first interlayer insulating layer 110, and the active contacts AC may be electrically connected to the first and second source/drain patterns SD1 and SD2.

The formation of the active contact AC may include forming a barrier pattern BM, and forming a conductive pattern FM on the barrier pattern BM. The barrier pattern BM may be conformally formed and may include a metal layer/a metal nitride layer. The conductive pattern FM may include a low-resistance metal.

Figure 10A:
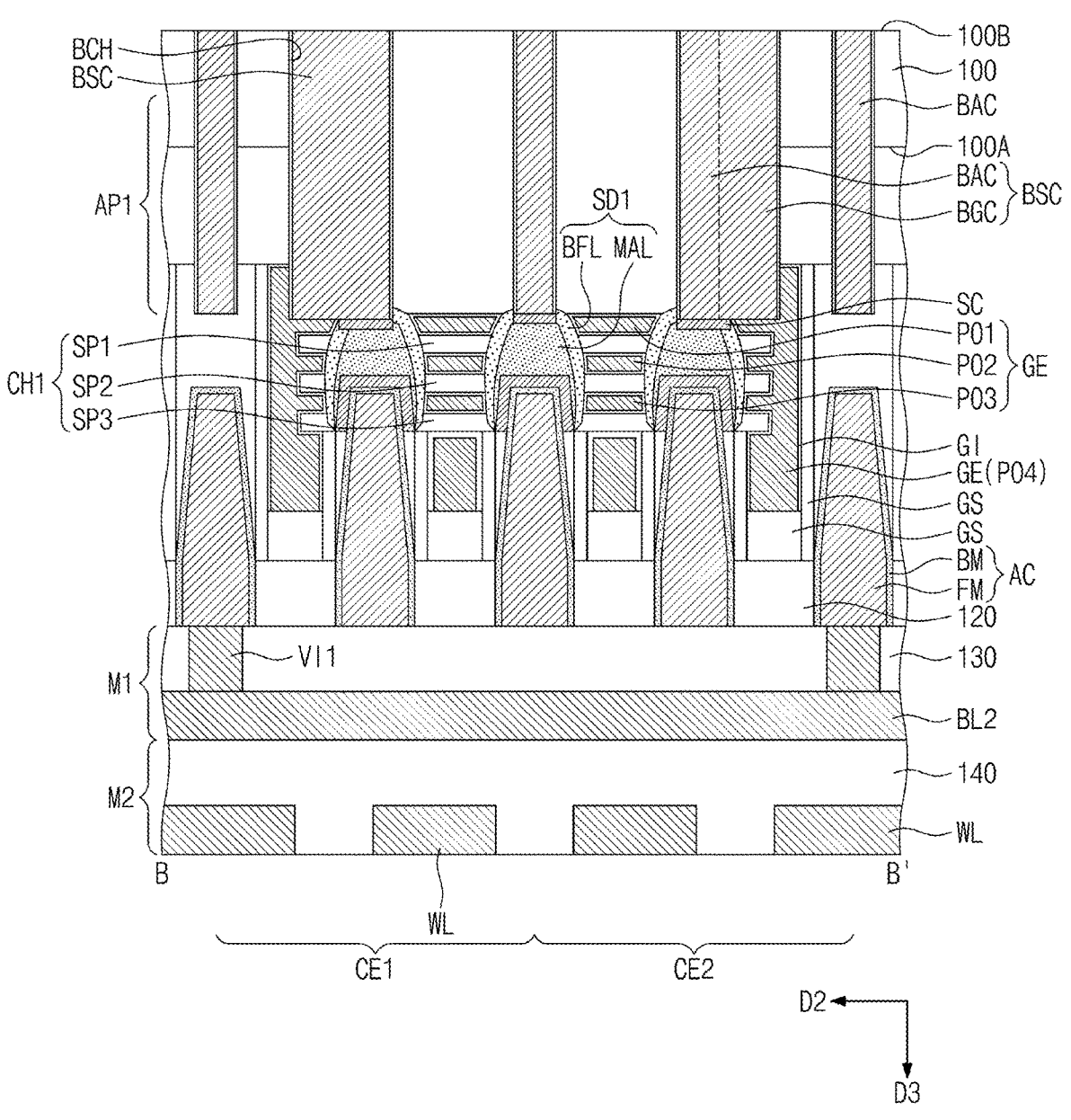
Figure 10B:
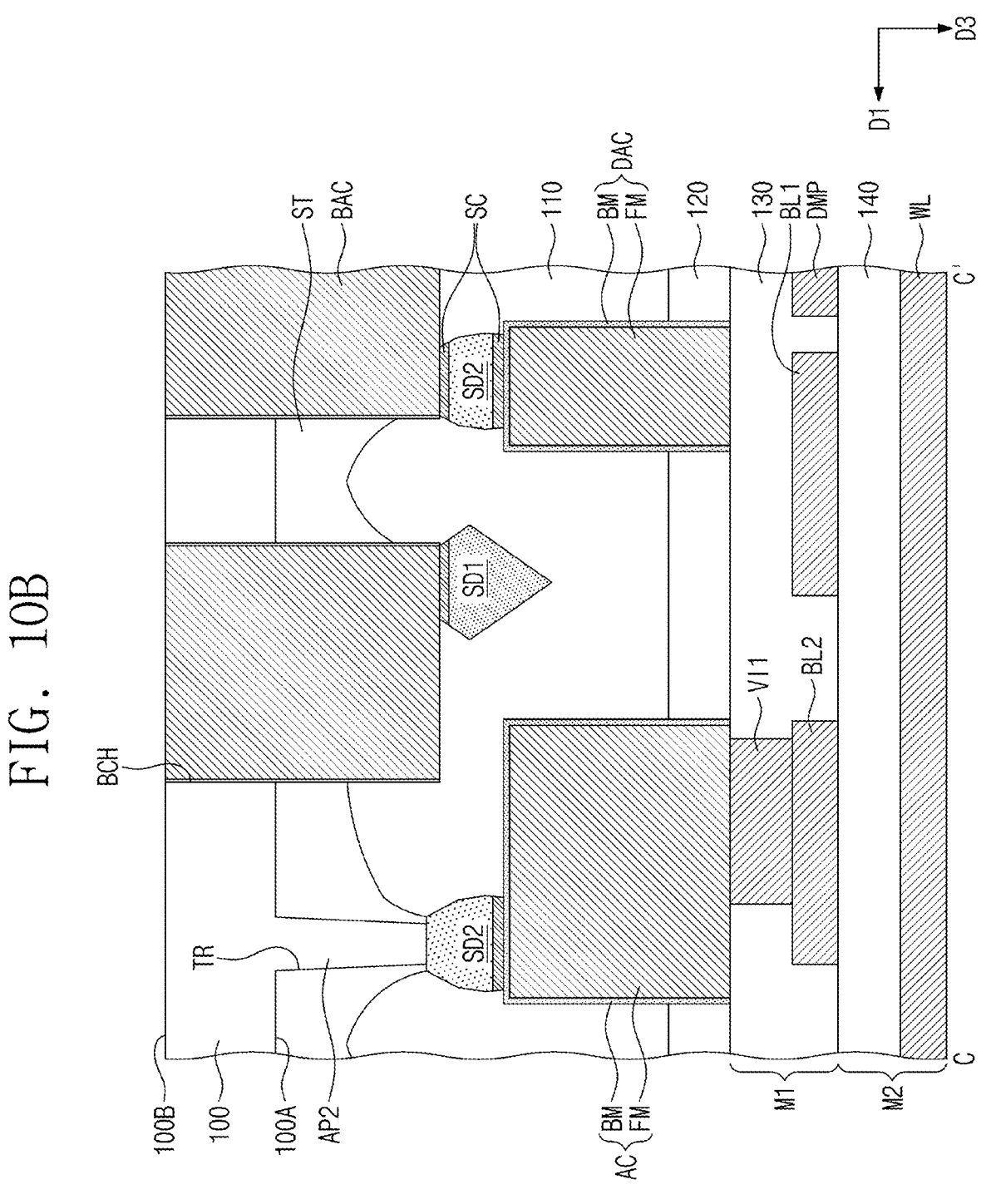
Figure 10C:
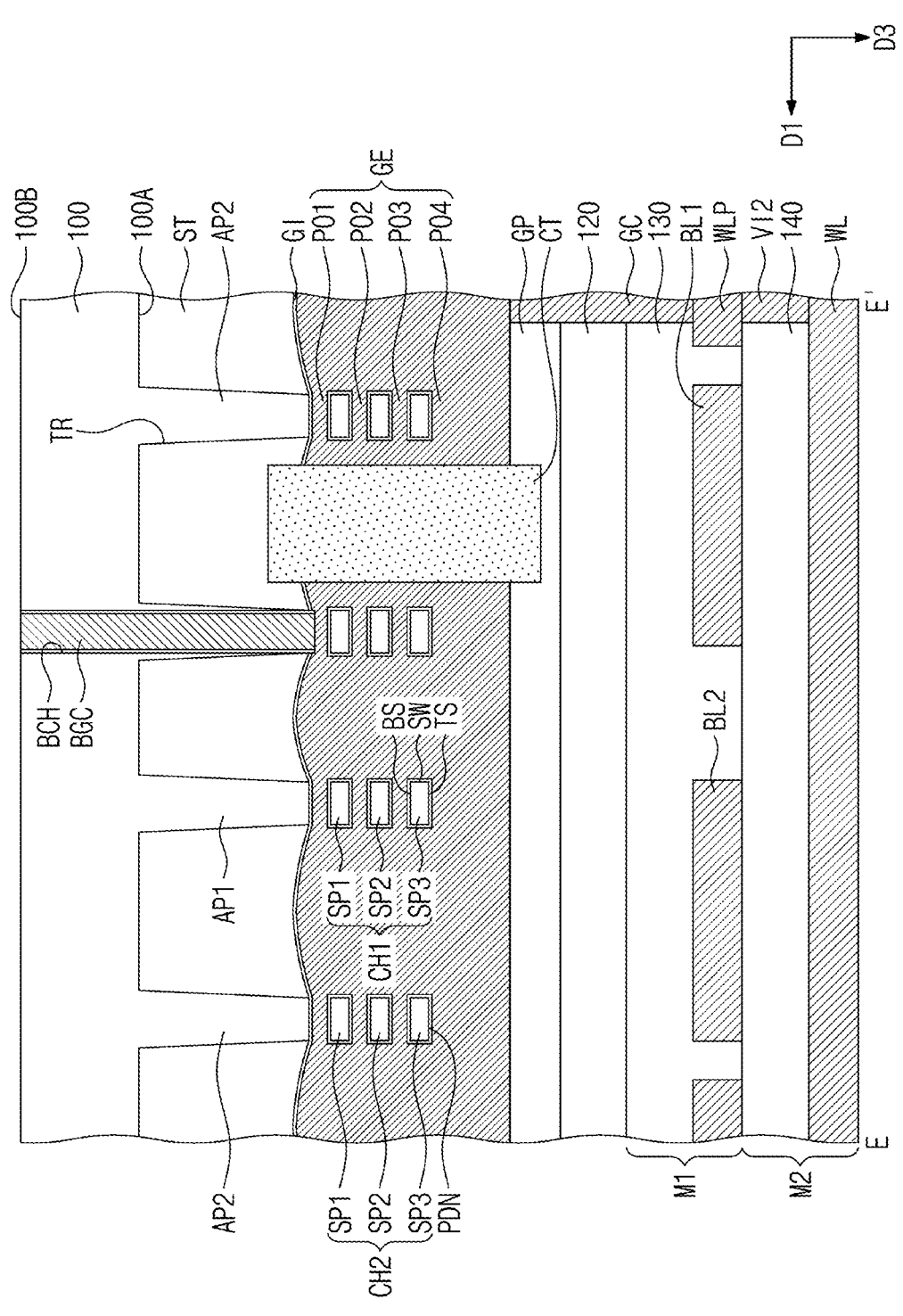

Referring to FIGS. 10A to 10C, a first metal layer M1 and a second metal layer M2 may be sequentially formed on the second interlayer insulating layer 120. The first metal layer M1 may include first bit lines BL1, second bit lines BL2, word line pads WLP, and dummy pads DMP. A gate contact GC connecting the word line pad WLP and the gate electrode GE may further be formed. The second metal layer M2 may include word lines WL. Even though not shown in FIGS. 10A to 10C, an additional BEOL layer may be formed on the second metal layer M2.

Backside contact holes BCH may be formed on the second surface 100B of the substrate 100. The backside contact hole BCH may penetrate a portion of the substrate 100 to vertically extend from the second surface 100B to a lower portion of the source/drain pattern SD1 or SD2. The backside contact hole BCH may expose the source/drain pattern SD1 or SD2. At least one of the backside contact holes BCH may expose the gate electrode GE as well as the source/drain pattern SD1 or SD2.

A contact spacer may be formed on an inner sidewall of each of the backside contact holes BCH. Backside active contacts BAC and backside gate contacts BGC may be formed by filling the backside contact holes BCH with a conductive material. The backside active contact BAC may be electrically connected to the source/drain pattern SD1 or SD2 (see FIG. 10B). A metal-semiconductor compound layer SC may be formed between the backside active contact BAC and the source/drain pattern SD1 or SD2. The backside gate contact BGC may be electrically connected to the gate electrode GE (see FIG. 10C). One of the backside active contacts BAC and a corresponding one of the backside gate contacts BGC may be connected to each other to form a shared contact BSC (see FIG. 10A).

Referring again to FIGS. 4A to 4E, a lower insulating layer LIL may be formed on the second surface 100B of the substrate 100. A backside metal layer BSM may be formed on the lower insulating layer LIL. The backside metal layer BSM may include ground lines VSS and power lines VDD. Each of the ground lines VSS and the power lines VDD may be electrically connected to a corresponding one of the backside active contacts BAC through a lower via BVI.

A power delivery network layer PDN may be formed on the backside metal layer BSM. The power delivery network layer PDN may be formed to apply a ground voltage to the ground lines VSS. The power delivery network layer PDN may be formed to apply a power voltage to the power lines VDD.

Hereinafter, various embodiments will be described. In the following embodiments, the descriptions to the same technical features as mentioned with reference to FIGS. 3A, 3B and 4A to 4E will not be repeated and differences between the following embodiments and the embodiments of FIGS. 3A, 3B and 4A to 4E will be mainly described, for the purpose of ease and convenience in explanation. FIGS. 11 to 15 are cross-sectional views illustrating semiconductor memory devices according to some embodiments.

Figure 11:
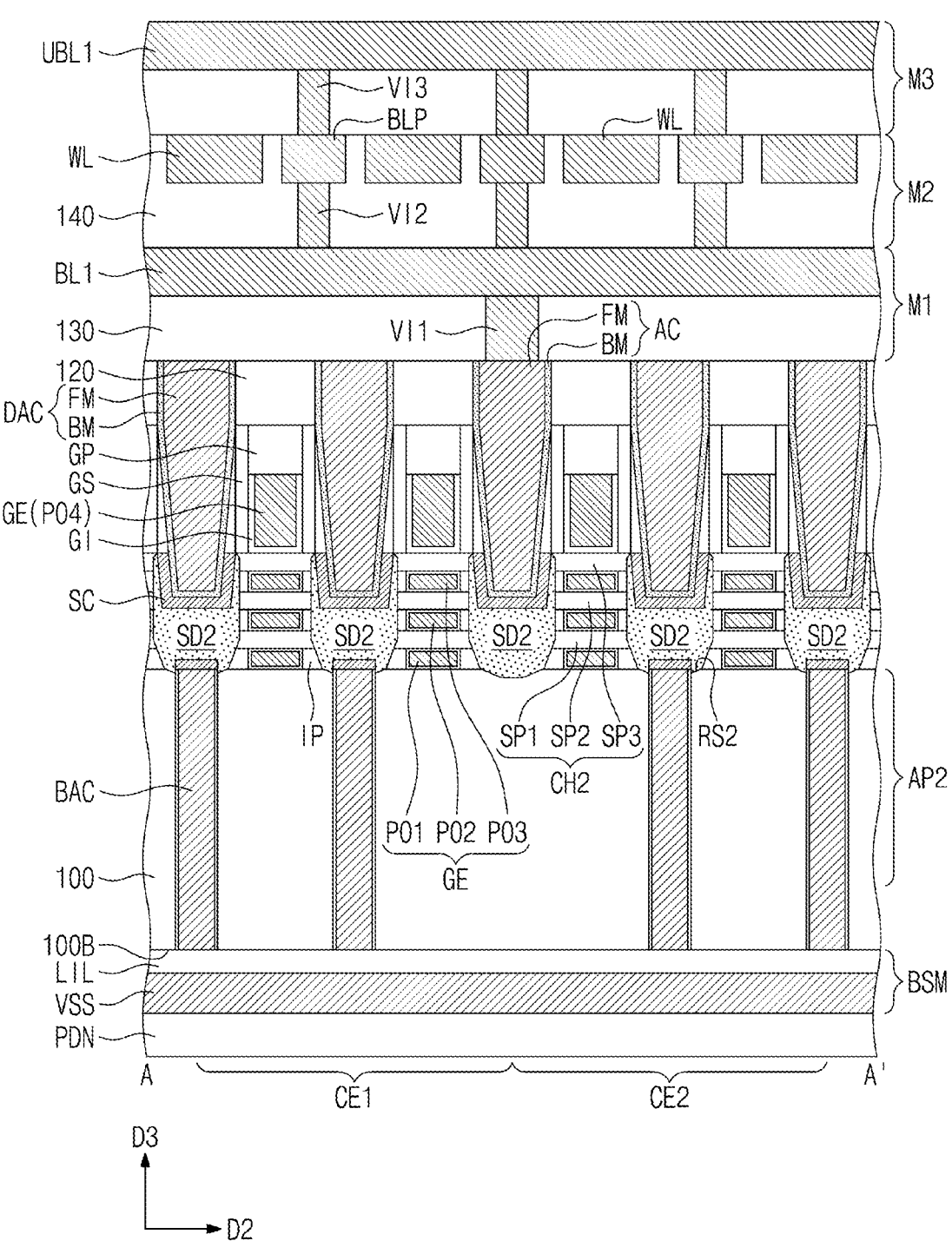
FIGS. 11 to 15 are cross-sectional views illustrating semiconductor memory devices according to some embodiments.

FIG. 11 is a cross-sectional view taken along the lines A-A' of FIGS. 3A and 3B. Referring to FIG. 11, a second metal layer M2 may further include bit line pads BLP. Each of the bit line pads BLP may be provided between the word lines WL adjacent to each other. The bit line pad BLP may have an island shape.

A third metal layer M3 provided on the second metal layer M2 may include upper bit lines UBL. For example, the upper bit lines UBL may include a first upper bit line UBL1 vertically overlapping with the first bit line BL1. The first upper bit line UBL1 may extend in the second direction D2 in parallel to the first bit line BL1. The bit line pads BLP may be arranged in the second direction D2 between the first upper bit line UBL1 and the first bit line BL1.

The first bit line BL1 may be electrically connected to the first upper bit line UBL1 through second vias VI2, the bit line pads BLP and third vias VI3. Thus, a signal may flow through the first upper bit line UBL1 as well as the first bit line BL1. The signal may flow through two paths (i.e., the first bit line BL1 and the first upper bit line UBL1), and thus a resistance may be reduced. As a result, a speed and electrical characteristics of a semiconductor memory device may be improved.

Figure 12:
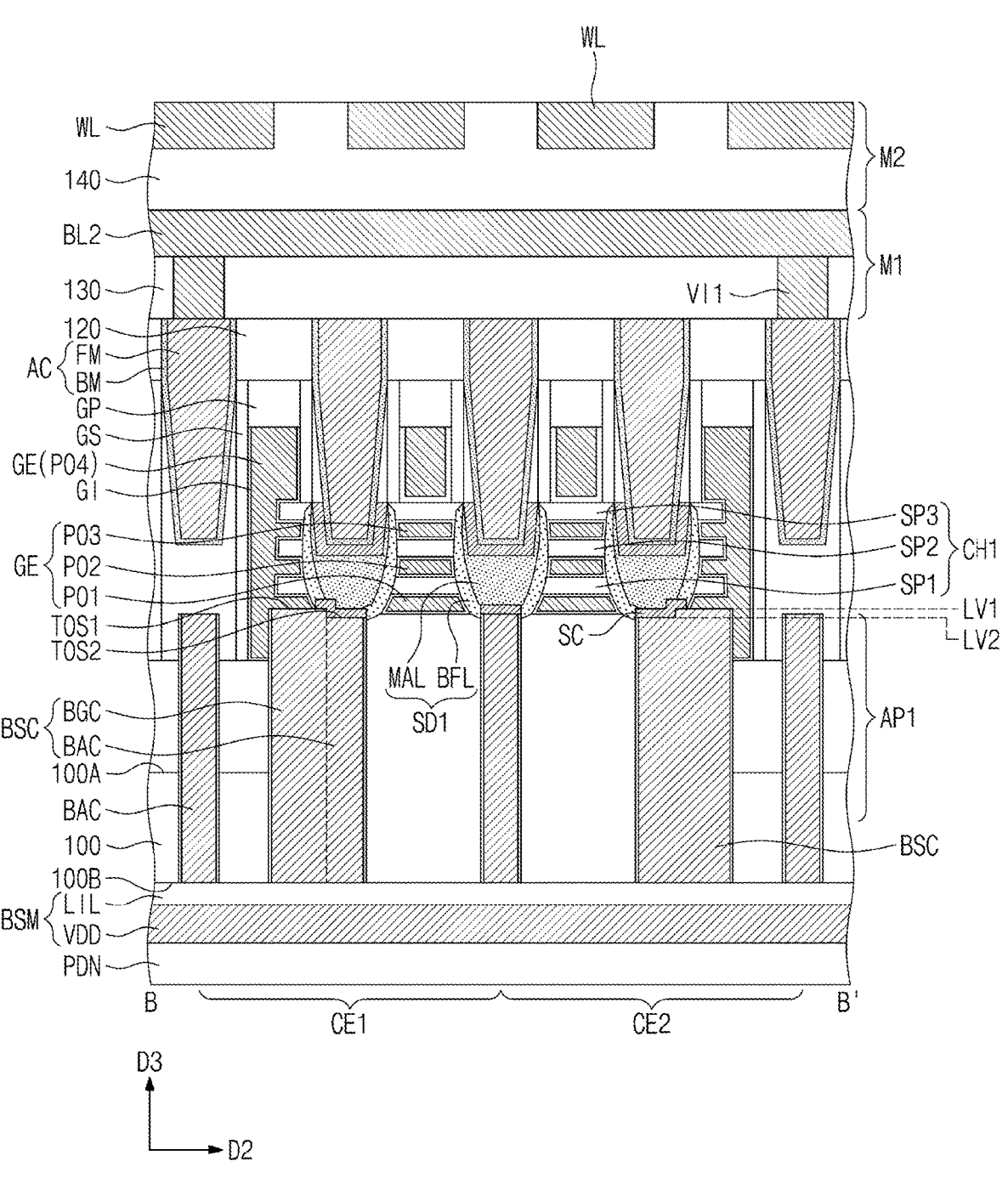

FIG. 12 is a cross-sectional view taken along the lines B-B' of FIGS. 3A and 3B. Referring to FIG. 12, the backside gate contact BGC of the shared contact BSC may have a first top surface TOS1, and the backside active contact BAC of the shared contact BSC may have a second top surface TOS2. A level LV1 of the first top surface TOS1 may be different from a level LV2 of the second top surface TOS2. In some embodiments, the level LV1 of the first top surface TOS1 may be higher than the level LV2 of the second top surface TOS2. In certain embodiments, the level LV1 of the first top surface TOS1 may be lower than the level LV2 of the second top surface TOS2.

Figure 13:
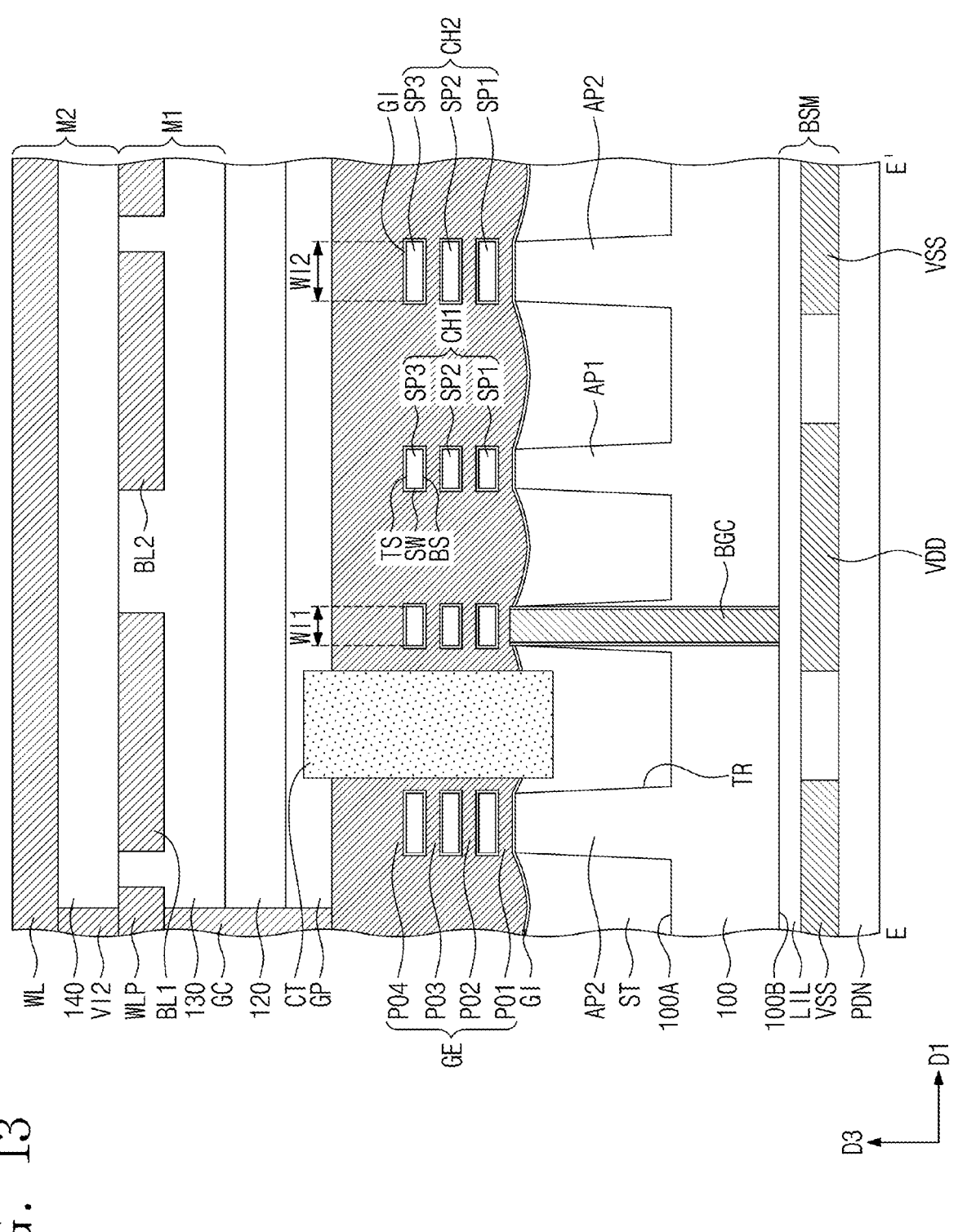

FIG. 13 is a cross-sectional view taken along the lines E-E' of FIGS. 3A and 3B. Referring to FIG. 13, the first channel pattern CH1 may have a first width WI1 in the first direction D1. The second channel pattern CH2 may have a second width WI2 in the first direction D1. The first width WI1 may be different from the second width WI2. In some embodiments, the second width WI2 may be greater than the first width WI1. In other words, a size of the channel of the NMOSFET may be greater than a size of the channel of the PMOSFET, and thus driving force of the NMOSFET may be greater than driving force of the PMOSFET.

Figure 14:
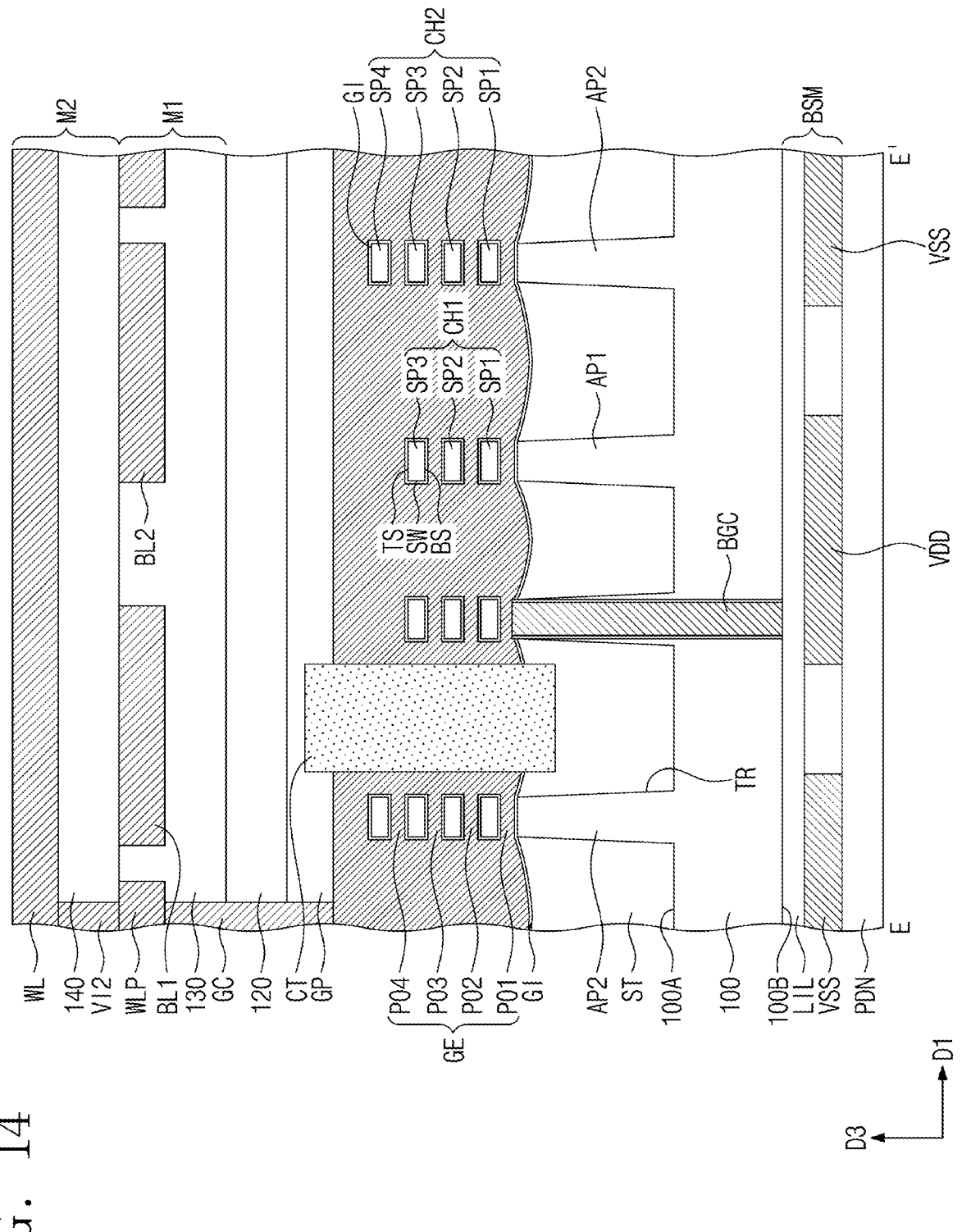

FIG. 14 is a cross-sectional view taken along the lines E-E' of FIGS. 3A and 3B. Referring to FIG. 14, a second channel pattern CH2 may further include a fourth semiconductor pattern SP4 in addition to the stacked first to third semiconductor patterns SP1, SP2 and SP3. In other words, the number of nanosheets of the NMOSFET may be greater than the number of nanosheets of the PMOSFET. Thus, the driving force of the NMOSFET may be greater than the driving force of the PMOSFET. Even though not shown in the drawings, as described above with reference to FIG. 13, a width of the nanosheet of the NMOSFET and the number of the nanosheets of the NMOSFET may be greater than a width of the nanosheet of the PMOSFET and the number of the nanosheets of the PMOSFET, respectively.

Figure 15:
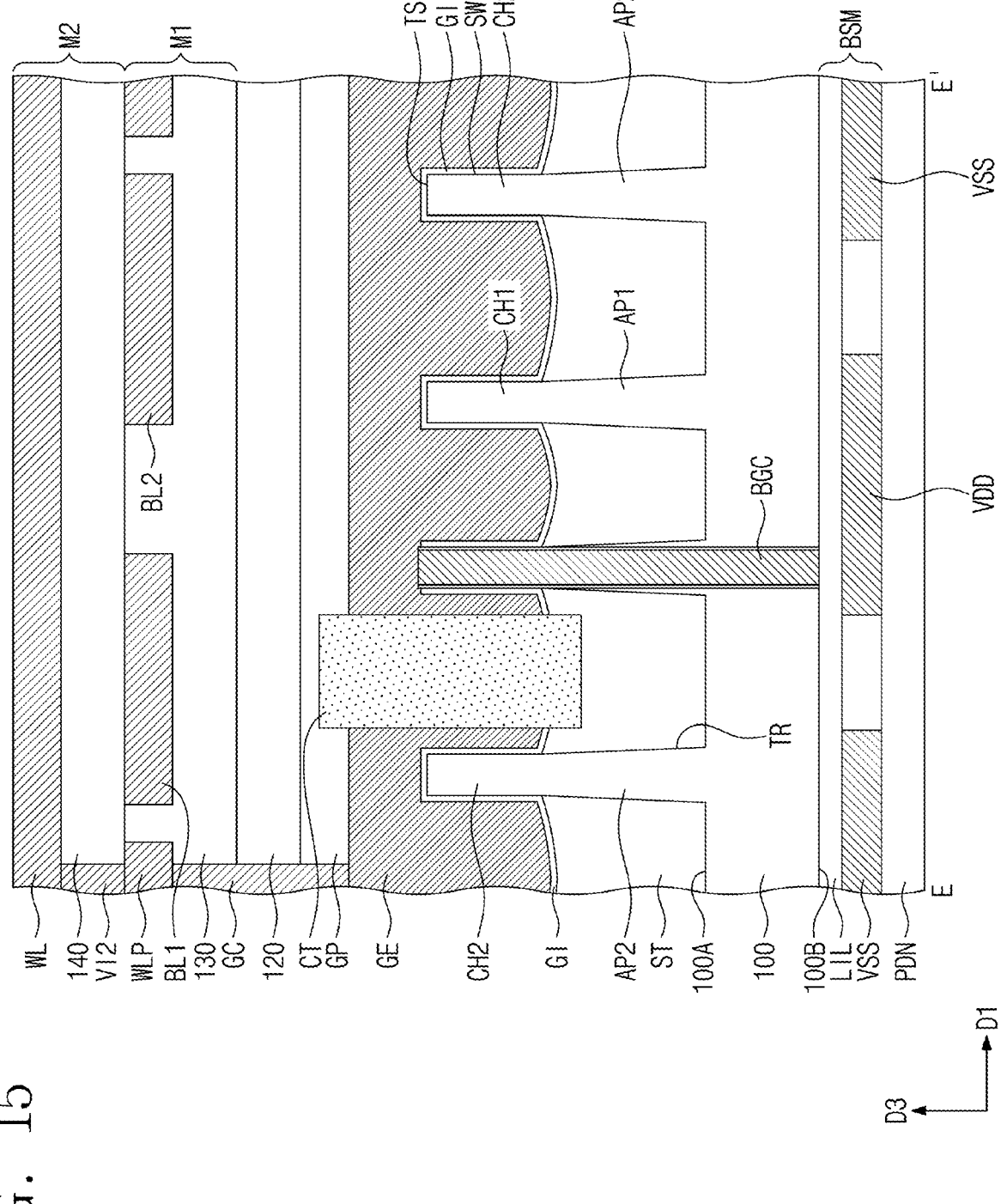

FIG. 15 is a cross-sectional view taken along the lines E-E' of FIGS. 3A and 3B. Referring to FIG. 15, each of upper portions of first and second active patterns AP1 and AP2 may have a fin shape vertically protruding above the device isolation layer ST. In other words, each of the first and second active patterns AP1 and AP2 may be an active fin. A gate electrode GE may be provided on a top surface TS and both sidewalls SW of each of first and second channel patterns CH1 and CH2. A transistor according to the present embodiments may be a three-dimensional field effect transistor (e.g., a FinFET) in which a gate electrode three-dimensionally surrounds a channel.

Figure 16A:
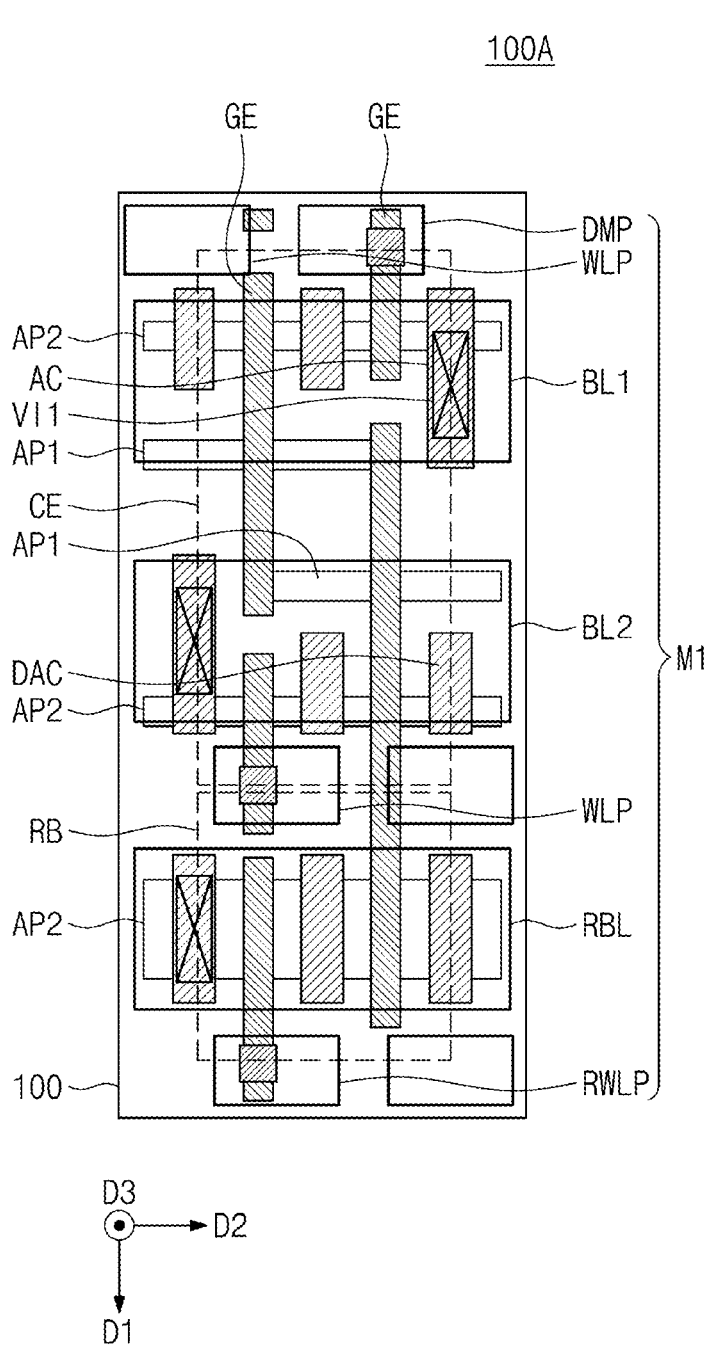
FIG. 16A is a plan view of a first surface of a substrate to illustrate a semiconductor memory device according to some embodiments.
Figure 16B:
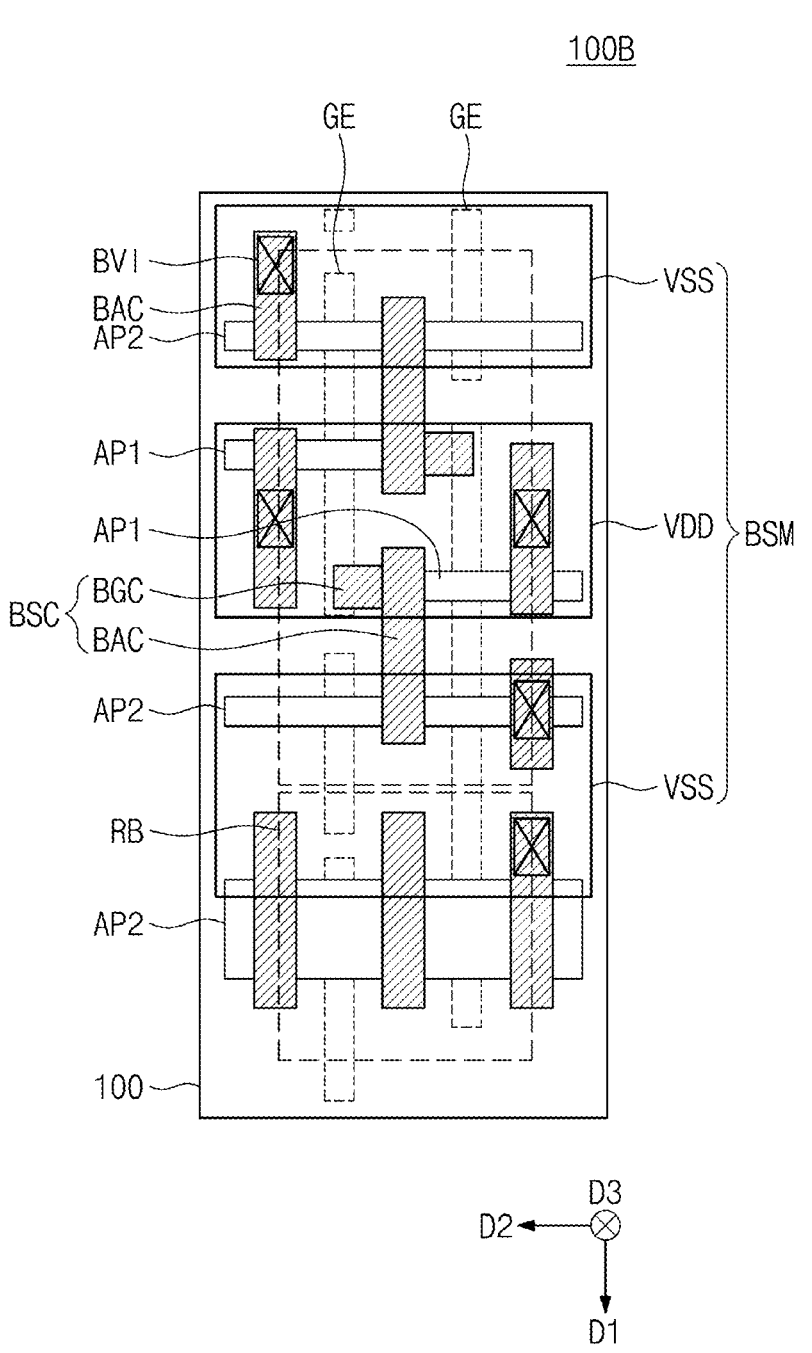
FIG. 16B is a plan view of a second surface of the substrate to illustrate a semiconductor memory device according to some embodiments.

FIG. 16A is a plan view of a first surface of a substrate to illustrate a semiconductor memory device according to some embodiments. FIG. 16B is a plan view of a second surface of the substrate to illustrate a semiconductor memory device according to some embodiments.

Referring to FIGS. 16A and 16B, a read buffer RB adjacent to a bit cell CE in the first direction D1 may further be provided. The read buffer RB may include an NMOSFET. For example, the read buffer RB may include a second active pattern AP2. A width of the second active pattern AP2 of the read buffer RB may be equal to or greater than a width of the second active pattern AP2 of the bit cell CE.

A first metal layer M1 may further include a read bit line RBL and a read word line pad RWLP, which are provided on the read buffer RB. A gate electrode GE on the read buffer RB may be electrically connected to the read word line pad RWLP through a gate contact GC. A second source/drain pattern SD2 of the read buffer RB may be electrically connected to the read bit line RBL through an active contact AC. Another second source/drain pattern SD2 of the read buffer RB may be electrically connected to the ground line VS S through a backside active contact BAC.

A SRAM cell according to the present embodiments may include the bit cell CE having six transistors (6T), and the read buffer RB having two transistors (2T). In other words, the SRAM cell of the present embodiments may be an 8T SRAM cell. The backside contacts BAC and BGC and the backside metal layer BSM may also be applied to the 8T SRAM cell.

According to embodiments, the node of the SRAM cell may include the shared contact provided from the back surface (or backside) of the substrate. Thus, the congestion degree of the MOL layer of the SRAM cell may be reduced and the sizes of the contacts in the MOL layer may be increased, thereby reducing the resistances in the MOL layer. The ground line and the power line of the SRAM cell may be provided in a backside interconnection layer. Thus, the congestion degree of the BEOL layer may be reduced and the sizes of the interconnection lines in the BEOL layer may be increased, thereby reducing the resistances in the BEOL layer. As a result, the electrical characteristics of the semiconductor memory device according to embodiments may be improved.

By way of summation and review, embodiments may provide a semiconductor memory device with improved electrical characteristics.

Embodiments may also provide a method of manufacturing the semiconductor memory device with improved electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims

What is claimed is:
1. A semiconductor memory device comprising:
a substrate including a first surface and a second surface opposite to the first surface;
a first active pattern on the first surface;
a first channel pattern on the first active pattern and a first source/drain pattern connected to the first channel pattern;
a gate electrode provided on the first channel pattern and extending in a first direction, the gate electrode being adjacent to the first source/drain pattern in a second direction intersecting the first direction;
a shared contact provided under the first source/drain pattern and the gate electrode and electrically connecting the first source/drain pattern and the gate electrode to each other; and
a backside metal layer on the second surface,
wherein the shared contact vertically extends from the second surface to the first source/drain pattern and the gate electrode, and
wherein the shared contact includes a backside active contact electrically connected to the first source/drain pattern, and a backside gate contact electrically connected to the gate electrode.
2. The semiconductor memory device as claimed in claim 1, wherein:
the backside gate contact has a first top surface,
the backside active contact has a second top surface, and
a level of the first top surface is different from a level of the second top surface.
3. The semiconductor memory device as claimed in claim 1,
wherein a bottom surface of the shared contact is substantially coplanar with the second surface.
4. The semiconductor memory device as claimed in claim 1, further comprising:
a second active pattern on the first surface; and
a second source/drain pattern on the second active pattern,
wherein the backside active contact is provided under the second source/drain pattern and connected to the second source/drain pattern, and
wherein the backside active contact is electrically connected to a ground line of the backside metal layer.
5. The semiconductor memory device as claimed in claim 1, further comprising:
a second active pattern on the first surface;

a second channel pattern on the second active pattern and a second source/drain pattern connected to the second channel pattern;

an active contact provided on the second source/drain pattern and connected to the second source/drain pattern; and a first metal layer on the active contact, wherein the first metal layer includes a first bit line, a second bit line, and a word line pad, and the active contact is electrically connected to one of the first and second bit lines.

6. The semiconductor memory device as claimed in claim 5, wherein the first metal layer further includes a dummy pad.

7. The semiconductor memory device as claimed in claim 5, further comprising:

a second metal layer and a third metal layer that are sequentially stacked on the first metal layer, wherein:

the second metal layer includes word lines and a bit line pad between the word lines, the third metal layer includes an upper bit line, and the one of the first and second bit lines is electrically connected to the upper bit line through the bit line pad.

8. The semiconductor memory device as claimed in claim 5, wherein each of the first and second channel patterns includes semiconductor patterns stacked sequentially, and wherein a width of each of the semiconductor patterns of the second channel pattern is greater than a width of each of the semiconductor patterns of the first channel pattern.

9. The semiconductor memory device as claimed in claim 5, wherein each of the first and second channel patterns includes semiconductor patterns stacked sequentially, and a number of the semiconductor patterns of the second channel pattern is greater than a number of the semiconductor patterns of the first channel pattern.

10. A semiconductor memory device comprising:

a SRAM cell on a substrate including a front surface and a back surface opposite to the front surface, wherein the SRAM cell includes:

first pull-up/down transistors and second pull-up/down transistors on the front surface; and a first node connecting a common source/drain of the first pull-up/down transistors to a common gate of the second pull-up/down transistors, wherein the first node includes a shared contact connected to the common source/drain and the common gate, the shared contact electrically connecting the common source/drain and the common gate to each other, the shared contact is buried in a lower portion of the substrate, and the shared contact includes a backside active contact electrically connected to the common source/drain, and a backside gate contact electrically connected to the common gate, and wherein:

the backside active contact vertically extends from the back surface of the substrate to the common source/drain, and the backside gate contact vertically extends from the back surface of the substrate to the common gate.

11. The semiconductor memory device as claimed in claim 10, wherein a bottom surface of the shared contact is substantially coplanar with the back surface of the substrate.

12. The semiconductor memory device as claimed in claim 10, wherein:

the backside gate contact has a first top surface, the backside active contact has a second top surface, and a level of the first top surface is different from a level of the second top surface.

13. The semiconductor memory device as claimed in claim 10, further comprising:

a first metal layer on the front surface of the substrate;

a second metal layer on the first metal layer; and a backside metal layer on the back surface of the substrate, wherein the SRAM cell further includes:

a first bit line and a second bit line in the first metal layer;

a word line in the second metal layer; and a ground line and a power line in the backside metal layer.

14. A semiconductor memory device comprising:

a bit cell region on a substrate including a first surface and a second surface opposite to the first surface;

a first active pattern and a second active pattern on the bit cell region on the first surface, the first active pattern being spaced apart from the second active pattern in a first direction;

a device isolation layer filling a trench between the first and second active patterns;

a first channel pattern on the first active pattern and a first source/drain pattern connected to the first channel pattern;

a second channel pattern on the second active pattern and a second source/drain pattern connected to the second channel pattern;

a gate electrode provided on the first channel pattern and extending in the first direction;

a gate insulating layer between the gate electrode and the first channel pattern;

a gate spacer on at least one sidewall of the gate electrode;

a gate capping pattern on the gate electrode;

an interlayer insulating layer on the gate capping pattern;

an active contact penetrating the interlayer insulating layer so as to be connected to the second source/drain pattern;

a first metal layer on the interlayer insulating layer, the first metal layer including a bit line electrically connected to the active contact; and a shared contact provided under the first source/drain pattern and the gate electrode and electrically connecting the first source/drain pattern and the gate electrode to each other, wherein the shared contact vertically extends from the second surface to the first source/drain pattern and the gate electrode and the shared contact includes a backside active contact electrically connected to the first source/drain pattern, and a backside gate contact electrically connected to the gate electrode.

15. The semiconductor memory device as claimed in claim 14, further comprising:

metal-semiconductor compound layers provided between the shared contact and the first source/drain pattern and between the active contact and the second source/drain pattern, respectively.

16. The semiconductor memory device as claimed in claim 14, further comprising:

a backside metal layer provided on a back surface of the substrate, wherein the backside metal layer includes a ground line and a power line.

17. The semiconductor memory device as claimed in claim 14, further including:

a second metal layer on the first metal layer, wherein the second metal layer includes a word line.

18. The semiconductor memory device as claimed in claim 14, wherein:

the backside gate contact has a first top surface, the backside active contact has a second top surface, and a level of the first top surface is different from a level of the second top surface.

* * * * *